United States Patent
Suzuki et al.

(10) Patent No.: US 11,689,180 B2
(45) Date of Patent: Jun. 27, 2023

(54) ACOUSTIC WAVE DEVICE

(71) Applicant: Murata Manufacturing Co., Ltd., Nagaokakyo (JP)

(72) Inventors: Takanao Suzuki, Nagaokakyo (JP); Koji Miyamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 391 days.

(21) Appl. No.: 16/896,263

(22) Filed: Jun. 9, 2020

(65) Prior Publication Data

US 2020/0304092 A1    Sep. 24, 2020

Related U.S. Application Data

(63) Continuation of application No. PCT/JP2018/039061, filed on Oct. 19, 2018.

(30) Foreign Application Priority Data

Dec. 19, 2017 (JP) .............................. JP2017-242526

(51) Int. Cl.
  *H03H 9/02* (2006.01)
  *H03H 9/145* (2006.01)

(52) U.S. Cl.
  CPC .... *H03H 9/02228* (2013.01); *H03H 9/02842* (2013.01); *H03H 9/14541* (2013.01)

(58) Field of Classification Search
  CPC ........... H03H 9/02; H03H 9/1457; H03H 9/25
  See application file for complete search history.

(56) References Cited

U.S. PATENT DOCUMENTS 6,552,631 B2 * 4/2003 Huor .................... H03H 9/6483
                                                              333/195
7,250,832 B2 * 7/2007 Kondratiev .............. H03H 9/64
                                                              333/195

(Continued)

FOREIGN PATENT DOCUMENTS

JP    03-242013 A    10/1991
JP    08-65089 A     3/1996

(Continued)

OTHER PUBLICATIONS

Official Communication issued in International Patent Application No. PCT/JP2018/039061, dated Jan. 15, 2019.

*Primary Examiner* — Hafizur Rahman
*Assistant Examiner* — Alan Wong
(74) *Attorney, Agent, or Firm* — Keating & Bennett, LLP

(57) ABSTRACT

An acoustic wave device includes a piezoelectric body portion, an interdigital transducer electrode connected to a first terminal and a second terminal, and a reflector connected to the second terminal. In the interdigital transducer electrode, in the interdigital transducer electrode, where, of a group of electrode fingers, the electrode finger located at one end in a second direction is a first end electrode finger and the electrode finger located at another end is a second end electrode finger, the first end electrode finger is located between the reflector and the second end electrode finger in the second direction. An outer busbar portion of one of a first busbar and a second busbar, not connected to the first end electrode finger, is located on an inner side in the second direction relative to a center portion, in a first direction, of the first end electrode finger.

10 Claims, 16 Drawing Sheets

(56) References Cited

U.S. PATENT DOCUMENTS

| | | | | |
|---|---|---|---|---|
| 8,222,971 | B2* | 7/2012 | Shin | H03H 9/0057 |
| | | | | 333/195 |
| 9,712,139 | B2* | 7/2017 | Taniguchi | H03H 9/6426 |
| 10,009,009 | B2* | 6/2018 | Mimura | H03H 9/1457 |
| 10,171,061 | B2* | 1/2019 | Iwamoto | H03H 9/1457 |
| 10,840,878 | B2* | 11/2020 | Daimon | H03H 9/25 |
| 2002/0000897 | A1 | 1/2002 | Huor | |
| 2012/0068790 | A1 | 3/2012 | Yoshimoto | |
| 2012/0306594 | A1 | 12/2012 | Tanaka | |
| 2016/0072475 | A1 | 3/2016 | Mimura et al. | |
| 2017/0222619 | A1* | 8/2017 | Iwamoto | H03H 9/54 |

FOREIGN PATENT DOCUMENTS

| | | | |
|---|---|---|---|
| JP | 2002-016470 A | 1/2002 | |
| JP | 2011-259516 A | 12/2011 | |
| JP | 2012-065272 A | 3/2012 | |
| WO | 2011/099532 A1 | 8/2011 | |
| WO | 2014/192756 A1 | 12/2014 | |
| WO | WO-2016084526 A1 * | 6/2016 | H03H 9/02574 |

* cited by examiner

ACOUSTIC WAVE DEVICE

CROSS REFERENCE TO RELATED APPLICATIONS

This application claims the benefit of priority to Japanese Patent Application No. 2017-242526 filed on Dec. 19, 2017 and is a Continuation Application of PCT Application No. PCT/JP2018/039061 filed on Oct. 19, 2018. The entire contents of each application are hereby incorporated herein by reference.

BACKGROUND OF THE INVENTION

1. Field of the Invention

The present invention generally relates to an acoustic wave device and, more specifically, to an acoustic wave device including an interdigital transducer electrode.

2. Description of the Related Art

As an acoustic wave device, there is known an acoustic wave device that includes a piezoelectric substrate (piezoelectric body portion) and an interdigital transducer electrode provided on or above the piezoelectric substrate and in which wide portions are provided in part of electrode fingers of the interdigital transducer electrode (see, for example, International Publication No. 2014/192756). In an example of the acoustic wave device described in International Publication No. 2014/192756, a reflector is formed on each side of the interdigital transducer electrode in a propagation direction of surface acoustic waves on the piezoelectric substrate. The interdigital transducer electrode and the reflectors include a metal material. The acoustic wave device described in International Publication No. 2014/192756 has such characteristics that the acoustic wave device has a structure of suppressing a transverse-mode ripple by forming a piston mode in the interdigital transducer electrode.

In the acoustic wave device described in International Publication No. 2014/192756, the interdigital transducer electrode includes a first busbar, a second busbar disposed apart from the first busbar, a plurality of first electrode fingers of which proximal ends are electrically connected to the first busbar and distal ends are have a greater width toward the second busbar, and a plurality of second electrode fingers of which proximal ends are connected to the second busbar and distal ends are have a greater width toward the first busbar. In the above-described acoustic wave device, wide portions are provided in both of the first electrode fingers and the second electrode fingers.

The first busbar includes a plurality of opening portions separately disposed along a length direction of the first busbar. The first busbar includes an inner busbar portion located closer to the first electrode fingers than the plurality of opening portions and having a greater width in the length direction of the first busbar, a center busbar portion in which the plurality of opening portions is provided, and an outer busbar portion located across the center busbar portion from the inner busbar portion.

The second busbar includes a plurality of opening portions separately disposed along a length direction of the second busbar. The second busbar includes an inner busbar portion located closer to the second electrode fingers than the plurality of opening portions and having a greater width in the length direction of the second busbar, a center busbar portion in which the plurality of opening portions is provided, and an outer busbar portion located across the center busbar portion from the inner busbar portion.

In the acoustic wave device in which the wide portions are provided in a portion of the electrode fingers of the interdigital transducer electrode, for example, the outer busbar portions are located adjacent to metal material portions such as reflectors different in potential in end regions of the interdigital transducer electrode in the length directions of the first busbar and second busbar, so a surge breakdown sometimes occurs in the outer busbar portions because of electrostatic discharge (ESD).

SUMMARY OF THE INVENTION

Preferred embodiments of the present invention provide acoustic wave devices that are each able to significantly improve ESD tolerance while significantly reducing or preventing interference with a piston mode.

An acoustic wave device according to a preferred embodiment of the present invention includes a first terminal, a second terminal, a piezoelectric body portion, an interdigital transducer electrode, and a reflector. The second terminal has a lower potential than the first terminal. The interdigital transducer electrode is provided on or above the piezoelectric body portion and electrically connected to the first terminal and the second terminal. The reflector is provided on or above the piezoelectric body portion and electrically connected to the second terminal. The interdigital transducer electrode includes a first busbar, a second busbar, a plurality of first electrode fingers, and a plurality of second electrode fingers. The first busbar is electrically connected to the first terminal. The second busbar is opposed to the first busbar in a first direction and electrically connected to the second terminal. The plurality of first electrode fingers are connected to the first busbar and have a greater width from the first busbar toward the second busbar in the first direction. The plurality of second electrode fingers are connected to the second busbar and have a greater width from the second busbar toward the first busbar in the first direction. The plurality of first electrode fingers and the plurality of second electrode fingers are spaced apart from each other in a second direction perpendicular or substantially perpendicular to the first direction. At least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger. Each of the first busbar and the second busbar includes an opening portion, an inner busbar portion, an outer busbar portion, and a coupling portion. The inner busbar portion is located closer to the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. In the interdigital transducer electrode, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located between the reflector and the second end electrode finger in the second direction. The outer busbar portion of one of the first busbar and the second busbar, not connected to the first end electrode finger, is located on an inner side in the second direction relative to a center portion, in the first direction, of the first end electrode finger.

An acoustic wave device according to a preferred embodiment of the present invention includes a first terminal, a second terminal, a piezoelectric body portion, a plurality of interdigital transducer electrodes, and two reflectors. The second terminal has a lower potential than the first terminal. The plurality of interdigital transducer electrodes are provided on or above the piezoelectric body portion and electrically connected to the first terminal and the second terminal. The two reflectors are provided on or above the piezoelectric body portion and reflect acoustic waves excited by the plurality of interdigital transducer electrodes. Each of the plurality of interdigital transducer electrodes includes a first busbar, a second busbar, a plurality of first electrode fingers, and a plurality of second electrode fingers. The second busbar is opposed to the first busbar in a first direction. The plurality of first electrode fingers are connected to the first busbar and have a greater width from the first busbar toward the second busbar in the first direction. The plurality of second electrode fingers are connected to the second busbar and have a greater width from the second busbar toward the first busbar in the first direction. The plurality of first electrode fingers and the plurality of second electrode fingers are spaced apart from each other in a second direction perpendicular or substantially perpendicular to the first direction. At least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger. Each of the first busbar and the second busbar includes an opening portion, an inner busbar portion, an outer busbar portion, and a coupling portion. The inner busbar portion is located closer to the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. The plurality of interdigital transducer electrodes are provided in the second direction. The two reflectors each are located across the interdigital transducer electrode at any one of both sides of the plurality of interdigital transducer electrodes provided in the second direction from the interdigital transducer electrode adjacent to the interdigital transducer electrode at the any one of both sides. In the interdigital transducer electrode adjacent to one of the two reflectors, of the plurality of interdigital transducer electrodes, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located between the one of the two reflectors and the second end electrode finger in the second direction. In the interdigital transducer electrode adjacent to the one of the two reflectors, the outer busbar portion of one of the first busbar and the second busbar, not connected to the first end electrode finger, is located on an inner side in the second direction relative to a center portion, in the first direction, of the first end electrode finger.

An acoustic wave device according to a preferred embodiment of the present invention includes a first terminal, a second terminal, a piezoelectric body portion, an interdigital transducer electrode, and a reflector. The second terminal has a lower potential than the first terminal. The interdigital transducer electrode is provided on or above the piezoelectric body portion and electrically connected to the first terminal and the second terminal. The reflector is provided on or above the piezoelectric body portion and electrically connected to the second terminal. The interdigital transducer electrode includes a first busbar, a second busbar, a plurality of first electrode fingers, and a plurality of second electrode fingers. The first busbar is electrically connected to the first terminal. The second busbar is opposed to the first busbar in a first direction and electrically connected to the second terminal. The plurality of first electrode fingers are connected to the first busbar and have a greater width from the first busbar toward the second busbar in the first direction. The plurality of second electrode fingers are connected to the second busbar and have a greater width from the second busbar toward the first busbar in the first direction. The plurality of first electrode fingers and the plurality of second electrode fingers are spaced apart from each other in a second direction perpendicular or substantially perpendicular to the first direction. At least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger. Each of the first busbar and the second busbar includes an opening portion, an inner busbar portion, an outer busbar portion, and a coupling portion. The inner busbar portion is located closer to the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. In the interdigital transducer electrode, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located between the reflector and the second end electrode finger in the second direction. The outer busbar portion of one of the first busbar and the second busbar, not connected to the first end electrode finger, is located on an inner side in the second direction relative to the inner busbar portion of the busbar not connected to the first end electrode finger.

An acoustic wave device according to a preferred embodiment of the present invention includes a first terminal, a second terminal, a piezoelectric body portion, a plurality of interdigital transducer electrodes, and two reflectors. The second terminal has a lower potential than the first terminal. The plurality of interdigital transducer electrodes are provided on or above the piezoelectric body portion and electrically connected to the first terminal and the second terminal. The two reflectors are provided on or above the piezoelectric body portion and reflect acoustic waves excited by the plurality of interdigital transducer electrodes. Each of the plurality of interdigital transducer electrodes includes a first busbar, a second busbar, a plurality of first electrode fingers, and a plurality of second electrode fingers. The second busbar is opposed to the first busbar in a first direction. The plurality of first electrode fingers are connected to the first busbar and have a greater width from the first busbar toward the second busbar in the first direction. The plurality of second electrode fingers are connected to the second busbar and have a greater width from the second busbar toward the first busbar in the first direction. The plurality of first electrode fingers and the plurality of second electrode fingers are spaced apart from each other in a second direction perpendicular or substantially perpendicular to the first direction. At least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger. Each of the first busbar and the second busbar includes an opening portion, an inner busbar portion, an outer busbar portion, and a coupling portion. The inner busbar portion is located closer to the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. The plurality of interdigital transducer electrodes are provided in the second direction. The two reflectors each are located across the interdigital transducer electrode at any one of both sides of the plurality of interdigital transducer electrodes provided in the second direction from the interdigital transducer electrode adjacent to the interdigital transducer electrode at the any one of both sides. In the interdigital transducer electrode adjacent to one of the two reflectors, of the plurality of interdigital transducer electrodes, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located between the one of the two reflectors and the second end electrode finger in the second direction. In the interdigital transducer electrode adjacent to the one of the two reflectors, the outer busbar portion of one of the first busbar and the second busbar, not connected to the first end electrode finger, is located on an inner side in the second direction relative to the inner busbar portion of the busbar not connected to the first end electrode finger.

An acoustic wave device according to a preferred embodiment of the present invention includes a first terminal, a second terminal, a piezoelectric body portion, and a plurality of interdigital transducer electrodes. The second terminal has a lower potential than the first terminal. The plurality of interdigital transducer electrodes is provided on or above the piezoelectric body portion and electrically connected to the first terminal and the second terminal. Each of the plurality of interdigital transducer electrodes includes a first busbar, a second busbar, a plurality of first electrode fingers, and a plurality of second electrode fingers. The second busbar is opposed to the first busbar in a first direction. The plurality of first electrode fingers are connected to the first busbar and have a greater width from the first busbar toward the second busbar in the first direction. The plurality of second electrode fingers are connected to the second busbar and have a greater width from the second busbar toward the first busbar in the first direction. The plurality of first electrode fingers and the plurality of second electrode fingers are spaced apart from each other in a second direction perpendicular or substantially perpendicular to the first direction. At least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger. Each of the first busbar and the second busbar includes an opening portion, an inner busbar portion, an outer busbar portion, and a coupling portion. The inner busbar portion is located closer to the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. Where, of the plurality of interdigital transducer electrodes, one of the two interdigital transducer electrodes adjacent to each other in the second direction is a first interdigital transducer electrode and another one of the two interdigital transducer electrodes is a second interdigital transducer electrode, a distance between the outer busbar portion not connected to, of a group of electrode fingers including the plurality of first electrode fingers and the plurality of second electrode fingers, the electrode finger closest to the second interdigital transducer electrode in the first interdigital transducer electrode and the outer busbar portion not connected to, of a group of electrode fingers including the plurality of first electrode fingers and the plurality of second electrode fingers, the electrode finger closest to the first interdigital transducer electrode in the second interdigital transducer electrode is greater than a distance between a center portion of the electrode finger closest to the second interdigital transducer electrode in the first interdigital transducer electrode and a center portion of the electrode finger closest to the first interdigital transducer electrode in the second interdigital transducer electrode.

An acoustic wave device according to a preferred embodiment of the present invention includes a first terminal, a second terminal, a piezoelectric body portion, and a plurality of interdigital transducer electrodes. The second terminal has a lower potential than the first terminal. The plurality of interdigital transducer electrodes are provided on or above the piezoelectric body portion and electrically connected to the first terminal and the second terminal. Each of the plurality of interdigital transducer electrodes includes a first busbar, a second busbar, a plurality of first electrode fingers, and a plurality of second electrode fingers. The second busbar is opposed to the first busbar in a first direction. The plurality of first electrode fingers are connected to the first busbar and have a greater width from the first busbar toward the second busbar in the first direction. The plurality of second electrode fingers are connected to the second busbar and have a greater width from the second busbar toward the first busbar in the first direction. The plurality of first electrode fingers and the plurality of second electrode fingers are spaced apart from each other in a second direction perpendicular or substantially perpendicular to the first direction. At least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger. Each of the first busbar and the second busbar includes an opening portion, an inner busbar portion, an outer busbar portion, and a coupling portion. The inner busbar portion is located closer to the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. Where, of the plurality of interdigital transducer electrodes, one of the two interdigital transducer electrodes adjacent to each other in the second direction is a first interdigital transducer electrode and another one of the two interdigital transducer electrodes is a second interdigital transducer electrode, and where, of a group of electrode fingers including the plurality of first electrode fingers and the plurality of second electrode fingers of the first interdigital transducer electrode, the electrode finger located at an end closer to the second interdigital transducer electrode in the second direction is a first end electrode finger of the first interdigital transducer electrode and the electrode finger located at an end away from the second interdigital transducer electrode is a second end electrode finger of the first interdigital transducer electrode, and, of a group of electrode fingers including the plurality of first electrode fingers and the plurality of second electrode fingers of the second interdigital transducer electrode, the electrode finger located at an end closer to the first interdigital transducer electrode in the second direction is a first end electrode finger of the second interdigital transducer electrode and the electrode finger located at an end away from the first interdigital transducer electrode is a second end electrode finger of the second interdigital transducer electrode, the first end electrode finger of the first interdigital transducer electrode is connected to the first terminal, and the first end electrode finger of the second interdigital transducer electrode is connected to the second terminal. In each of the first interdigital transducer electrode and the second interdigital transducer electrode, the outer busbar portion electrically connected to one of the first terminal and the second terminal, different from the terminal to which the first end electrode finger is connected, is located on an inner side in the second direction relative to the inner busbar portion electrically connected to the one of the first terminal and the second terminal, different from the terminal to which the first end electrode finger is connected.

An acoustic wave device according to a preferred embodiment of the present invention includes a first terminal, a second terminal, a piezoelectric body portion, and a plurality of interdigital transducer electrodes. The second terminal has a lower potential than the first terminal. The plurality of interdigital transducer electrodes are provided on or above the piezoelectric body portion and electrically connected to the first terminal and the second terminal. Each of the plurality of interdigital transducer electrodes includes a first busbar, a second busbar, a plurality of first electrode fingers, and a plurality of second electrode fingers. The second busbar is opposed to the first busbar in a first direction. The plurality of first electrode fingers are connected to the first busbar and have a greater width from the first busbar toward the second busbar in the first direction. The plurality of second electrode fingers are connected to the second busbar and have a greater width from the second busbar toward the first busbar in the first direction. The plurality of first electrode fingers and the plurality of second electrode fingers are spaced apart from each other in a second direction perpendicular or substantially perpendicular to the first direction. At least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger. Each of the first busbar and the second busbar includes an opening portion, an inner busbar portion, an outer busbar portion, and a coupling portion. The inner busbar portion is located closer to the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. In at least one interdigital transducer electrode of the plurality of interdigital transducer electrodes, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located closer to the interdigital transducer electrode adjacent to the at least one interdigital transducer electrode in the second direction. In the at least one interdigital transducer electrode, the outer busbar portion of one of the first busbar and the second busbar, not connected to the first end electrode finger, is located on an inner side in the second direction relative to the inner busbar portion of one of the first busbar and the second busbar, not connected to the first end electrode finger, at least at a side closer to the adjacent interdigital transducer electrode.

Acoustic wave devices according to preferred embodiments of the present invention are each able to significantly improve ESD tolerance while significantly reducing or preventing interference with a piston mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
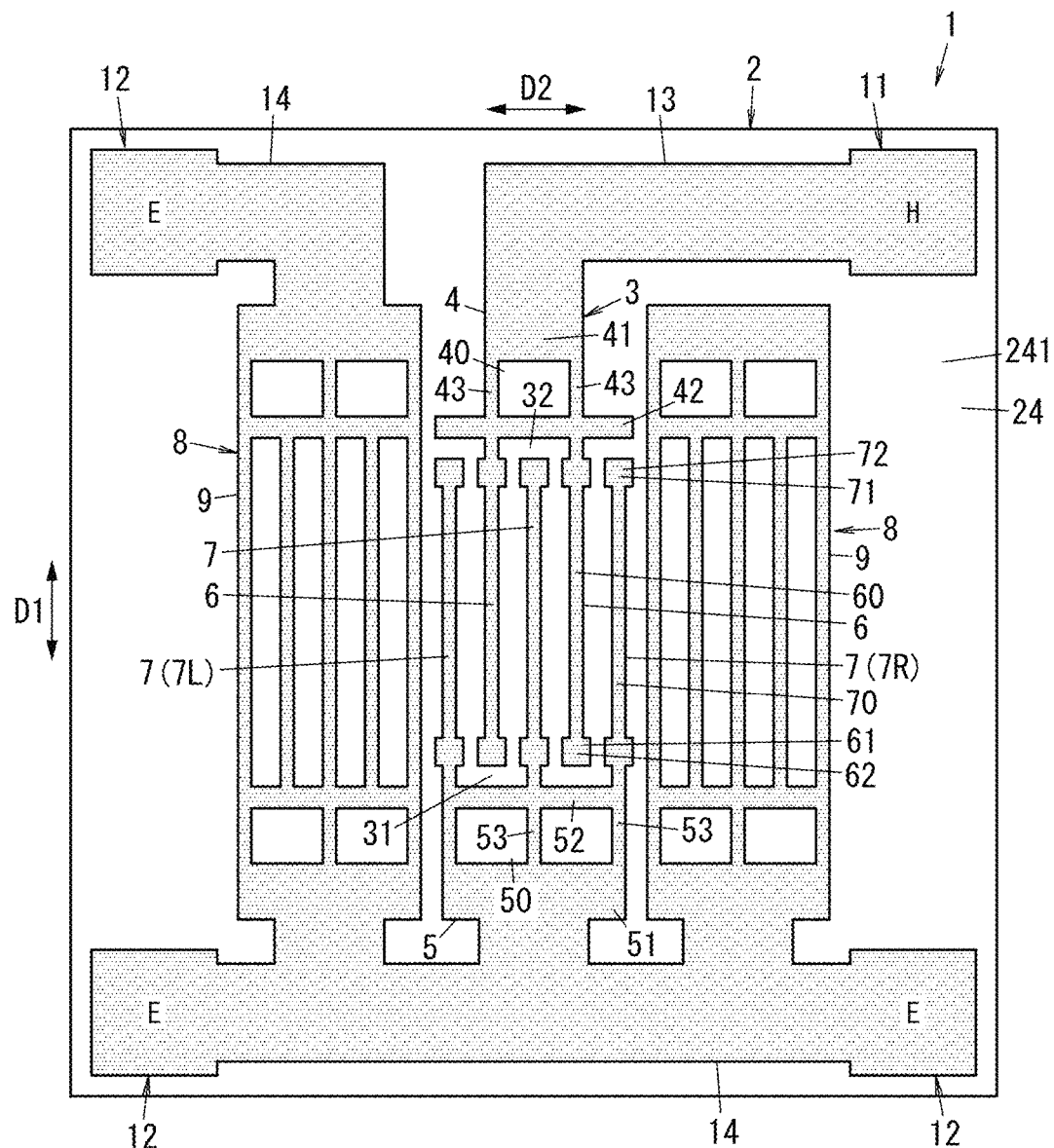
FIG. 1 is a plan view of an acoustic wave device according to a first preferred embodiment of the present invention.

Hereinafter, acoustic wave devices according to preferred embodiments will be described with reference to the drawings.

FIG. 1 to FIG. 17 that will be used in the following preferred embodiments, and the like, all are representative diagrams, and the ratios of the sizes and thicknesses of components in the drawings do not always reflect actual scale ratios.

First Preferred Embodiment (1.1) Overall Configuration of Acoustic Wave Device Hereinafter, an acoustic wave device 1 according to a first preferred embodiment of the present invention will be described with reference to the drawings.

As shown in FIG. 1, FIG. 2A, FIG. 2B, FIG. 3, and FIG. 4, the acoustic wave device 1 according to the first preferred embodiment includes a first terminal (for example, a signal terminal) 11, second terminals (for example, ground terminals) 12, a piezoelectric body portion 24, an interdigital transducer (IDT) electrode 3, and reflectors 8. Each second terminal 12 has a lower potential than the first terminal 11. Therefore, the first terminal 11 has a higher potential than each second terminal 12. The first terminal 11 and the second terminals 12 are provided on or above the piezoelectric body portion 24. Here, the state "provided on or above the piezoelectric body portion 24" includes the case of being directly provided on the piezoelectric body portion 24 and the case of being indirectly provided on the piezoelectric body portion 24. The acoustic wave device 1 includes the plurality of (for example, three) second terminals 12. However, the acoustic wave device 1 only needs to include at least one second terminal 12. The piezoelectric body portion 24 I made of a piezoelectric material. The interdigital transducer electrode 3 and the reflectors 8 are provided on or above the piezoelectric body portion 24. Here, the state "provided on or above the piezoelectric body portion 24" includes the case of being directly provided on the piezoelectric body portion 24 and the case of being indirectly provided on the piezoelectric body portion 24. The acoustic wave device 1 according to the first preferred embodiment is a single-port surface acoustic wave resonator. The acoustic wave device 1 includes the two reflectors 8.

Figure 2A:
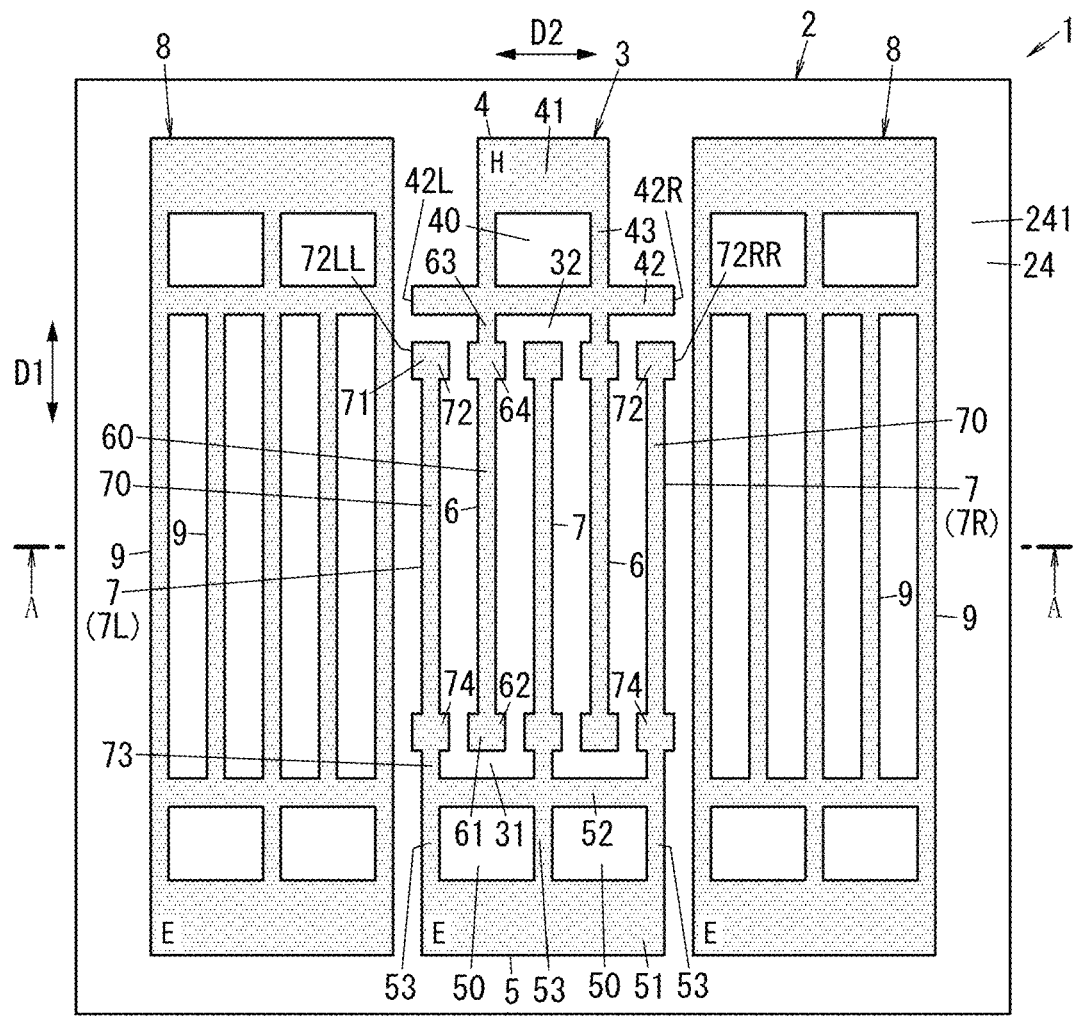
FIG. 2A is a plan view of a portion of the acoustic wave device according to the first preferred embodiment of the present invention.

The acoustic wave device 1 according to the first preferred embodiment further includes a first wiring layer 13 electrically connecting the interdigital transducer electrode 3 and the first terminal 11 and a second wiring layer 14 electrically connecting the interdigital transducer electrode 3 and the second terminals 12. In FIG. 1, for the sake of convenience of description, the label "H" is assigned to the first terminal 11 and portions (high potential portions) electrically connected to the first terminal 11 in the interdigital transducer electrode 3, and the label "E" is assigned to the second terminals 12 and portions (low potential portions) electrically connected to the second terminals 12 in the interdigital transducer electrode 3. The high potential portions are different in potential from the low potential portions. The high potential portions are portions higher in potential than the low potential portions. The labels "H", "E" are not signs and are not actually present. In FIG. 1 and FIG. 2A, dot hatching is applied to the interdigital transducer electrode 3 and the reflectors 8. These hatchings do not represent cross sections and are provided to clearly show the relationship among the interdigital transducer electrode 3, the reflectors 8, and the piezoelectric body portion 24. In FIG. 1, dot hatching is applied to the first terminal 11, the second terminals 12, the first wiring layer 13, and the second wiring layer 14. These hatchings do not represent cross sections and are provided to clearly show the relationship among the first terminal 11, the second terminals 12, the first wiring layer 13 and the second wiring layer 14, and the piezoelectric body portion 24.

In the acoustic wave device 1 according to the first preferred embodiment, the piezoelectric body portion 24 is a piezoelectric film, and the above-described interdigital transducer electrode 3 is provided on or above a multilayer board including the piezoelectric body portion 24. The multilayer board 2 is a piezoelectric substrate at least partially having piezoelectricity.

(1.2) Components of Acoustic Wave Device

Next, the components of the acoustic wave device 1 will be described with reference to the drawings.

(1.2.1) Multilayer Board

Figure 2B:
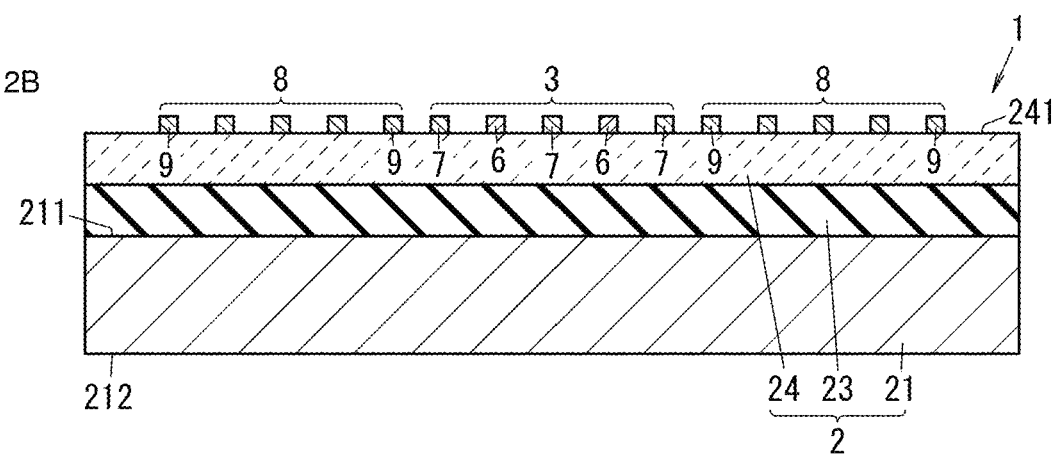
FIG. 2B relates to the above acoustic wave device and is a cross-sectional view taken along the line A-A in FIG. 2A.

As shown in FIG. 2B, the multilayer board 2 includes a high acoustic velocity support substrate 21, a low acoustic velocity film 23 directly laminated on the high acoustic velocity support substrate 21 and through which bulk waves propagate at a lower acoustic velocity than acoustic waves that propagate through the piezoelectric body portion 24, and the piezoelectric body portion 24 directly laminated on the low acoustic velocity film 23. In the high acoustic velocity support substrate 21, bulk waves propagate at a higher acoustic velocity than acoustic waves that propagate through the piezoelectric body portion 24. The low acoustic velocity film 23 is provided on or above the high acoustic velocity support substrate 21. Here, the state "provided on or above the low acoustic velocity film 23" includes the case of being directly provided on the low acoustic velocity film 23 and the case of being indirectly provided on the low acoustic velocity film 23. The piezoelectric body portion 24 is indirectly laminated on the high acoustic velocity support substrate 21. Accordingly, since the low acoustic velocity film 23 is located between the high acoustic velocity support substrate 21 and the piezoelectric body portion 24 in the acoustic wave device 1, the acoustic velocity of acoustic waves decreases. The energy of acoustic waves substantially concentrates in a low acoustic velocity medium. Therefore, with the acoustic wave device 1, the effect of enclosing acoustic wave energy into the piezoelectric body portion 24 and the interdigital transducer electrode 3 in which acoustic waves are excited is significantly improved. Therefore, with the acoustic wave device 1, a loss is reduced, and the quality factor is increased, in comparison with the case where no low acoustic velocity film 23 is provided.

The piezoelectric body portion 24$i$ is preferably made of, for example, lithium tantalate ($LiTaO_3$), lithium niobate ($LiNbO_3$), zinc oxide (ZnO), aluminum nitride (AlN), or lead zirconate titanate (PZT).

The high acoustic velocity support substrate 21 supports a multilayer body including the low acoustic velocity film 23 and the piezoelectric body portion 24. Here, the high acoustic velocity support substrate 21 includes a first main surface 211 and a second main surface 212 that are on opposite sides in the thickness direction. The first main surface 211 and the second main surface 212 are provided back to back to each other. The plan-view shape of the high acoustic velocity support substrate 21 (the outer peripheral shape of the high acoustic velocity support substrate 21 when viewed in the thickness direction) is a square or substantially square shape, for example. However, the shape is not limited to a square or substantially square shape and may be, for example, a rectangular or substantially rectangular shape. The thickness of the high acoustic velocity support substrate 21 is preferably, for example, about 120 μm. The material of the high acoustic velocity support substrate 21 is preferably, for example, silicon. The high acoustic velocity support substrate 21 is not limited to silicon and may include any one of piezoelectric bodies, for example, aluminum nitride, aluminum oxide, silicon carbide, silicon nitride, sapphire, lithium tantalate, lithium niobate, and quartz crystal, various ceramics, for example, alumina, zirconia, cordierite, mullite, steatite, and forsterite, magnesia diamond, a material including any one of the above materials as a main ingredient, and a material including a mixture of some of the above materials as a main ingredient.

The low acoustic velocity film 23 is preferably made of, for example, any one of silicon oxide, glass, silicon oxynitride, tantalum oxide, a chemical compound provided by adding fluorine, carbon, or boron to silicon oxide, and a material including any one of the above materials as a main ingredient.

When the low acoustic velocity film 23 is silicon oxide, temperature characteristics are significantly improved. The elastic constant of lithium tantalate has negative temperature characteristics, and the elastic constant of silicon oxide has positive temperature characteristics. Therefore, with the acoustic wave device 1, the absolute value of temperature coefficient of frequency (TCF) is reduced. In addition, the specific acoustic impedance of silicon oxide is less than the specific acoustic impedance of lithium tantalate. Therefore, with the acoustic wave device 1, both an increase in electromechanical coupling coefficient, that is, an expansion of fractional band width and a significant improvement in temperature coefficient of frequency are provided.

The thickness of the piezoelectric body portion 24 is preferably less than or equal to about 3.5λ, for example, when the wave length of acoustic waves, which is determined by the electrode finger pitch of the interdigital transducer electrode 3, is λ. This is because the quality factor increases. In the acoustic wave device 1, when the thickness of the piezoelectric body portion 24 is less than or equal to about 2.5λ, for example, the temperature coefficient of frequency significantly improves. In addition, in the acoustic wave device 1, when the thickness of the piezoelectric body portion 24 is less than or equal to about 1.5λ substantially, adjustment of acoustic velocity becomes easy. The thickness of the piezoelectric body portion 24 is preferably, for example, about 600 nm.

The thickness of the low acoustic velocity film 23 is preferably less than or equal to about 2.0λ, for example, when the wave length of acoustic waves, which is determined by the electrode finger pitch of the interdigital transducer electrode 3, is λ. In the acoustic wave device 1, when the thickness of the low acoustic velocity film 23 is less than or equal to about 2.0λ, for example, membrane stress is reduced. As a result, warpage of wafer that is the source of the high acoustic velocity support substrate 21 during manufacturing is reduced, and an efficacy percentage is able to be significantly increased and characteristics are able to be stabilized. The thickness of the low acoustic velocity film 23 is, for example, about 600 nm.

(1.2.2) Reflector

The two reflectors 8 are provided on or above one main surface 241 of the piezoelectric body portion 24. Here, the two reflectors 8 are provided one by one on both sides of the interdigital transducer electrode 3 in the second direction D2.

Each of the two reflectors 8 reflects acoustic waves. Each of the two reflectors 8 is a grating-type reflector. Each of the two reflectors 8 include a plurality of electrode fingers 9. One ends of the plurality of electrode fingers 9 in the first direction D1 are short-circuited, and the other ends are also short-circuited. In FIG. 1, FIG. 2A, FIG. 2B, and the like, each of the two reflectors 8 is drawn with the number of the electrode fingers 9 reduced to facilitate visualization. The reflectors 8 each may be made of an appropriate metal material, for example, aluminum (Al), copper (Cu), platinum (Pt), gold (Au), silver (Ag), titanium (Ti), nickel (Ni), chromium (Cr), molybdenum (Mo), tungsten (W), and an alloy including any one of these metals as a main ingredient. Alternatively, the reflectors 8 each may include a structure in which a plurality of metal films including any one of these metals or alloys is laminated. The thickness of each reflector 8 is preferably, for example, about 150 nm.

(1.2.3) Interdigital Transducer Electrode

The interdigital transducer electrode 3 may include an appropriate metal material, for example, aluminum, copper, platinum, gold, silver, titanium, nickel, chromium, molybdenum, tungsten, and an alloy including any one of these metals as a main ingredient. Alternatively, the interdigital transducer electrode 3 may include a structure in which a plurality of metal films including any one of these metals or alloys is laminated. The thickness of the interdigital transducer electrode 3 is preferably, for example, about 150 nm.

As shown in FIG. 1 and FIG. 2A, the interdigital transducer electrode 3 includes a first busbar 4, a second busbar 5, a plurality of first electrode fingers 6, and a plurality of second electrode fingers 7.

In the interdigital transducer electrode 3, the first busbar 4 and the second busbar 5 are opposed to each other in a first direction D1 perpendicular or substantially perpendicular to the thickness direction (up-down direction in FIG. 2B) of the piezoelectric body portion 24. In other words, the second busbar 5 is opposed to the first busbar 4 in the first direction D1.

Figure 4:
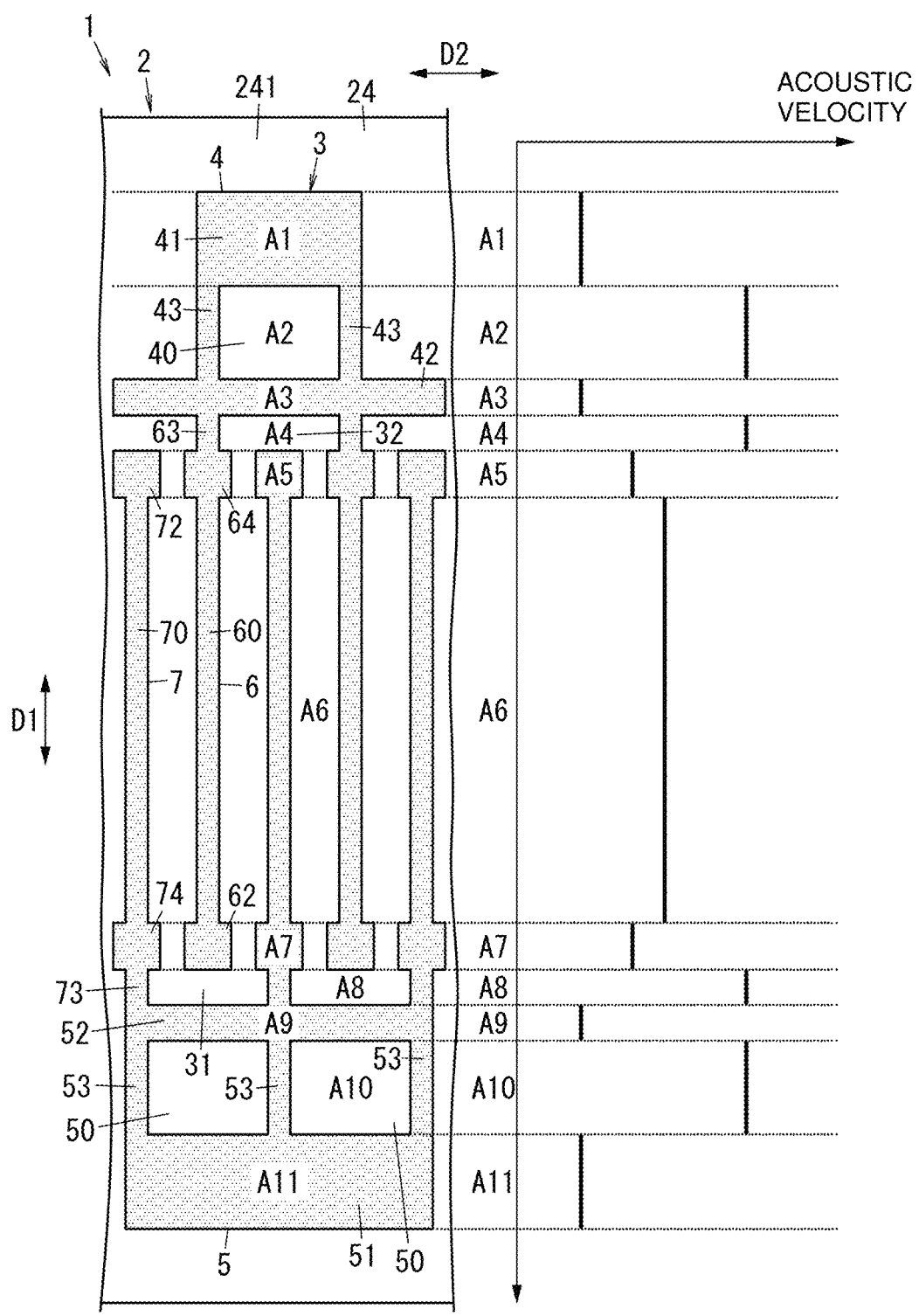
FIG. 4 is a view showing a velocity distribution, in a first direction, of an acoustic velocity of acoustic waves that propagate in an acoustic wave propagation direction (second direction) in the above acoustic wave device.

The first busbar 4 and the second busbar 5 each have a long shape having a second direction D2 perpendicular or substantially perpendicular to the first direction D1 as a longitudinal direction. In FIG. 1, FIG. 2A, FIG. 4, and the like, the first busbar 4 and the second busbar 5 do not look like a long shape. This is because each of the number of the first electrode fingers 6 and the number of the second electrode fingers 7 is reduced to facilitate visualization. The second direction D2 is a direction along a propagation direction of acoustic waves. The second direction D2 is also perpendicular or substantially perpendicular to the thickness direction of the piezoelectric body portion 24.

The plurality of first electrode fingers 6 are connected to the first busbar 4 and have a greater width from the first busbar 4 toward the second busbar 5 in the first direction D1. Here, the plurality of first electrode fingers 6 have greater widths from the first busbar 4 along a direction perpendicular or substantially perpendicular to the longitudinal direction of the first busbar 4. In other words, the plurality of first electrode fingers 6 have greater widths along a direction perpendicular or substantially perpendicular to the propagation direction of acoustic waves. In the interdigital transducer electrode 3, the plurality of first electrode fingers 6 is spaced apart from the second busbar 5, and a gap 31 is provided between the first electrode fingers 6 and the second busbar 5 that are opposed to each other in the first direction D1. When the wave length of the above-described acoustic waves is λ, the length of the gap 31 in the first direction D1 is preferably, for example, less than or equal to about 0.5λ.

In the example of FIG. 1 and FIG. 2A, the plurality of first electrode fingers 6 each have the same or substantially the same length. A distal end portion 61 of each of the plurality of first electrode fingers 6 includes a wide portion 62 having a greater width in the second direction D2 than a center portion 60, in the first direction D1, of the first electrode finger 6. Each of the plurality of first electrode fingers 6 includes a wide portion 64 (see FIG. 2A) in addition to the wide portion 62. The wide portion 64 is located between the center portion 60 and a proximal end portion 63 (see FIG. 2A), opposite from the distal end portion 61, of the first electrode finger 6. The wide portion 64 has a greater width in the second direction D2 than the center portion 60, in the first direction D1, of the first electrode finger 6. The wide portion 64 is located away from the first busbar 4 in the first direction D1. In each of the plurality of first electrode fingers 6, a portion between the wide portion 62 and the wide portion 64 in the first direction D1 is the center portion 60. In each of the plurality of first electrode fingers 6, the center portion 60 is longer in the first direction D1 than each of the wide portions 62, 64.

In the example of FIG. 1 and FIG. 2A, the center portion 60 of each of the plurality of first electrode fingers 6 has the same or substantially the same width. The wide portion 62 at the distal end portion 61 of each of the plurality of first electrode fingers 6 has the same or substantially the same width. The wide portion 64, closer to the proximal end portion 63, of each of the plurality of first electrode fingers 6 has the same or substantially the same width. The width of the wide portion 62 at the distal end portion 61 and the width of the wide portion 64 closer to the proximal end portion 63 are the same or substantially the same in each of the plurality of first electrode fingers 6. Each of the plurality of first electrode fingers 6 has a line-symmetric shape with respect to a center line 6X (see FIG. 3) along the first direction D1. The shape of each of the wide portions 62, 64 is a rectangular or substantially rectangular shape, for example. However, the shape is not limited thereto and may be, for example, a hexagonal or substantially hexagonal shape, a circular or substantially circular shape, or the like.

The plurality of second electrode fingers 7 are connected to the second busbar 5 and have a greater width from the second busbar 5 toward the first busbar 4 in the first direction D1. Here, the plurality of second electrode fingers 7 have greater widths from the second busbar 5 along a direction perpendicular or substantially perpendicular to the longitudinal direction of the second busbar 5. In other words, the plurality of second electrode fingers 7 have greater widths along a direction perpendicular or substantially perpendicular to the propagation direction of acoustic waves. In the interdigital transducer electrode 3, the plurality of second electrode fingers 7 are spaced apart from the first busbar 4, and a gap 32 is provided between the second electrode fingers 7 and the first busbar 4 that are opposed to each other in the first direction D1. When the wave length of the above-described acoustic waves is λ, the length of the gap 32 in the first direction D1 is preferably, for example, less than or substantially equal to about 0.5λ.

In the example of FIG. 1 and FIG. 2A, the plurality of second electrode fingers 7 each have the same or substantially the same length. A distal end portion 71 of each of the plurality of second electrode fingers 7 includes a wide portion 72 having a greater width in the second direction D2 than a center portion 70, in the first direction D1, of the second electrode finger 7. Each of the plurality of second electrode fingers 7 includes a wide portion 74 (see FIG. 2A) in addition to the wide portion 72. The wide portion 74 is located between the center portion 70 and a proximal end portion 73 (see FIG. 2A), opposite from the distal end portion 71, of the second electrode finger 7. The wide portion 74 has a greater width in the second direction D2 than the center portion 70, in the first direction D1, of the second electrode finger 7. The wide portion 74 is located away from the second busbar 5 in the first direction D1. In each of the plurality of second electrode fingers 7, a portion between the wide portion 72 and the wide portion 74 in the first direction D1 is the center portion 70. In each of the plurality of second electrode fingers 7, the center portion 70 is longer than each of the wide portions 72, 74 in the first direction D1.

In the example of FIG. 1 and FIG. 2A, the center portion 70 of each of the plurality of second electrode fingers 7 has the same or substantially the same width. The wide portion 72 at the distal end portion 71 of each of the plurality of second electrode fingers 7 has the same or substantially the same width. The wide portion 74, closer to the proximal end portion 73, of each of the plurality of second electrode fingers 7 has the same or substantially the same width. The width of the wide portion 72 at the distal end portion 71 and the width of the wide portion 74 closer to the proximal end portion 73 are the same or substantially the same in each of the plurality of second electrode fingers 7. Each of the plurality of second electrode fingers 7 has a line-symmetric shape with respect to a center line 7X (see FIG. 3) along the first direction D1. The shape of each of the wide portions 72, 74 is a rectangular or substantially rectangular shape; however, the shape is not limited thereto and may be, for example, a hexagonal or substantially hexagonal shape, a circular or substantially circular shape, or the like.

In the interdigital transducer electrode 3, the plurality of first electrode fingers 6 and the plurality of second electrode fingers 7 are provided alternately one by one and spaced apart from each other in the second direction D2 perpendicular or substantially perpendicular to the first direction D1. Therefore, the first electrode finger 6 and the second electrode finger 7 adjacent to each other in the second direction D2 are spaced apart from each other.

In the interdigital transducer electrode 3, the wide portions 62 of the distal end portions 61 of the plurality of first electrode fingers 6 and the wide portions 74, closer to the proximal end portions 73, of the second electrode fingers 7 are provided alternately one by one and spaced apart from each other in the second direction D2. In addition, in the interdigital transducer electrode 3, the wide portions 64, closer to the proximal end portions 63, of the plurality of first electrode fingers 6 and the wide portions 72 of the distal end portions 71 of the second electrode fingers 7 are provided alternately one by one and spaced apart from each other in the second direction D2. The electrode finger pitch of the interdigital transducer electrode 3 is about twice the distance between sides respectively corresponding to the center portion 60 of the first electrode finger 6 and the center portion 70 of the second electrode finger 7, adjacent to each other. The electrode finger pitch of the interdigital transducer electrode 3 is the same or substantially the same value when defined by the distance between the center lines 6X (see FIG. 3) of the adjacent two first electrode fingers 6 in the second direction D2 of the plurality of first electrode fingers 6. In addition, the electrode finger pitch of the interdigital transducer electrode 3 is the same or substantially the same value when defined by the distance between the center lines 7X (see FIG. 3) of the adjacent two second electrode fingers 7 in the second direction D2 of the plurality of second electrode fingers 7. A group of electrode fingers includes the plurality of first electrode fingers 6 and the plurality of second electrode fingers 7 spaced apart from each other in the second direction D2 perpendicular or substantially perpendicular to the first direction D1 and may also include the plurality of first electrode fingers 6 and the plurality of second electrode fingers 7 not provided alternately and spaced apart from each other. For example, a region in which the first electrode finger 6 and the second electrode finger 7 are provided one by one and spaced apart from each other and a region in which the two first electrode fingers 6 or the two second electrode fingers 7 are provided in the second direction D2 may be mixed.

The first busbar 4 includes opening portions 40, an inner busbar portion 42, an outer busbar portion 41, and coupling portions 43. The inner busbar portion 42 is located closer to the plurality of first electrode fingers 6 and the plurality of second electrode fingers 7 than the opening portions 40 in the first direction D1. The outer busbar portion 41 is located across the opening portions 40 from the inner busbar portion 42 in the first direction D1. In other words, the outer busbar portion 41 is located away in the first direction D1 from a side where the plurality of first electrode fingers 6 is present. The coupling portions 43 couple the inner busbar portion 42 and the outer busbar portion 41 in the first direction D1. The coupling portions 43 are located on both sides of each opening portion 40 in the second direction D2. In the example of FIG. 1, each coupling portion 43 has the same or substantially the same width as the center portion of the first electrode finger 6 and is located along an extension from the first electrode finger 6. However, the dimensions of each coupling portion 43 and the locations of the coupling portions 43 are not limited thereto.

The opening shape of each opening portion 40 is rectangular or substantially rectangular, for example. However, the opening shape is not limited thereto. When the wave length of the above-described acoustic waves is λ, the width of the inner busbar portion 42 in the first direction D1 is preferably, for example, less than or substantially equal to about 0.5λ. The length of each coupling portion 43 in the first direction D1 is preferably, for example, about 2.0λ.

The first busbar 4 includes the plurality of opening portions 40. However, to facilitate visualization, the number of the first electrode fingers 6 is reduced in FIG. 1 and FIG. 2A, such that only one opening portion 40 is shown in FIG. 1 and FIG. 2A. The plurality of opening portions 40 are, for example, located at equal or substantially equal intervals in the second direction D2. In the example of FIG. 1 and FIG. 2A, the opening width of each opening portion 40 in the second direction D2 is, for example, the same or substantially the same as the distance between the center portions 60 of the adjacent two first electrode fingers 6 in the second direction D2. Although only one opening portion 40 is shown in FIG. 1 and FIG. 2A as described above, the distance between the two adjacent opening portions 40 in the second direction D2 is, for example, the same or substantially the same as the width of the center portion 60 of the first electrode finger 6 in the second direction D2.

The second busbar 5 includes opening portions 50, an inner busbar portion 52, an outer busbar portion 51, and coupling portions 53. The inner busbar portion 52 is located closer to the plurality of first electrode fingers 6 and the plurality of second electrode fingers 7 than the opening portions 50 in the first direction D1. The outer busbar portion 51 is located across the opening portions 50 from the inner busbar portion 52 in the first direction D1. In other words, the outer busbar portion 51 is located away in the first direction D1 from a side where the plurality of second electrode fingers 7 is present. The coupling portions 53 couple the inner busbar portion 52 and the outer busbar portion 51 in the first direction D1. The coupling portions 53 are located on both sides of each opening portion 50 in the second direction D2. In the example of FIG. 1 and FIG. 2A, each coupling portion 53 has the same or substantially the same width as the center portion 70 of the second electrode finger 7 and is located along an extension from the second electrode finger 7. However, the dimensions of each coupling portion 53 and the locations of the coupling portions 53 are not limited thereto.

The opening shape of each opening portion 50 is rectangular or substantially rectangular, for example. However, the opening shape is not limited thereto. When the wave length of the above-described acoustic waves is λ, the width of the inner busbar portion 52 in the first direction D1 is preferably, for example, less than or equal to about 0.5λ. The length of each coupling portion 53 in the first direction D1 is preferably, for example, about 2.0λ.

The acoustic wave device 1 according to the first preferred embodiment includes a structure that significantly reduces or prevents a transverse-mode ripple by providing a piston mode in the interdigital transducer electrode 3. This point will be described with reference to FIG. 4.

As shown at the left side of FIG. 4, the acoustic wave device 1 includes 11 regions A1 to A11 in the first direction D1 in plan view taken in the thickness direction of the acoustic wave device 1. The 11 regions A1 to A11 respectively include different portions in each of the piezoelectric body portion 24 and the interdigital transducer electrode 3. FIG. 4 shows the velocity (acoustic velocity) of acoustic waves that propagate through the 11 regions A1 to A11 at the right side.

In the acoustic wave device 1, of the above-described 11 regions A1 to A11, the region A6 located in the center in the first direction D1 is a center region. The center region includes the center portions 60 of the plurality of first electrode fingers 6 and the center portions 70 of the plurality of second electrode fingers 7. In short, the center region is a region in which the center portions 60 of the plurality of first electrode fingers 6 and the center portions 70 of the plurality of second electrode fingers 7 overlap in the second direction D2. In the center region, a value (duty ratio) determined by dividing the electrode finger width (the width of each of the center portion 60 of the first electrode finger 6 and the center portion 70 of the second electrode finger) by a value half the above-described electrode finger pitch is preferably, for example, about 0.5.

In the acoustic wave device 1, of the above-described 11 regions A1 to A11, the regions A1, A11 respectively located at both ends in the first direction D1 are outer busbar regions. The region A1 includes the outer busbar portion 41 of the first busbar 4. The region A11 includes the outer busbar portion 51 of the second busbar 5. The acoustic velocity of acoustic waves in the outer busbar regions is lower than the acoustic velocity in the center region.

In the acoustic wave device 1, of the above-described 11 regions A1 to A11, the regions A2, A10 respectively located at the second from both ends in the first direction D1 are coupling regions. The region A2 includes the plurality of coupling portions 43 and plurality of opening portions 40 of the first busbar 4. The region A10 includes the plurality of coupling portions 53 and plurality of opening portions 50 of the second busbar 5. The acoustic velocity of acoustic waves in the coupling regions is higher than the acoustic velocity in the outer busbar regions or the acoustic velocity in the center region.

In the acoustic wave device 1, of the above-described 11 regions A1 to A11, the regions A3, A9 respectively located at the third from both ends in the first direction D1 are inner busbar regions. The region A3 includes the inner busbar portion 42 of the first busbar 4. The region A9 includes the inner busbar portion 52 of the second busbar 5. The acoustic velocity of acoustic waves in the inner busbar regions is lower than the acoustic velocity in the center region.

In the acoustic wave device 1, of the above-described 11 regions A1 to A11, the regions A4, A8 respectively located at the fourth from both ends in the first direction D1 are gap regions. The region A4 includes the proximal end portions 63 of the plurality of first electrode fingers 6 and the plurality of gaps 32. The region A8 includes the proximal end portions 73 of the plurality of second electrode fingers 7 and the plurality of gaps 31. The acoustic velocity of acoustic waves in the gap regions is higher than the acoustic velocity in the inner busbar regions or the acoustic velocity in the center region.

In the acoustic wave device 1, of the above-described 11 regions A1 to A11, the regions A5, A7 respectively located at the fifth from both ends in the first direction D1 are wide regions. The region A5 includes the wide portions 64 of the plurality of first electrode fingers 6 and the wide portions 72 of the plurality of second electrode fingers 7. The region A7 includes the wide portions 62 of the plurality of first electrode fingers 6 and the wide portions 74 of the plurality of second electrode fingers 7. The acoustic velocity of acoustic waves in the wide regions is lower than the acoustic velocity in the center region.

In the acoustic wave device 1, since the interdigital transducer electrode 3 is provided as described above, the low acoustic velocity regions (the regions A5, A3 and the regions A7, A9) are present on the outer side of the center region (the region A6), and the high acoustic velocity regions A2, A10 are present on the outer side of the low acoustic velocity regions. Therefore, the acoustic wave device 1 is able to provide a piston mode, so a transverse-mode ripple is significantly reduced or prevented.

(1.3) Potentials of Interdigital Transducer Electrode and Reflectors

Figure 5:
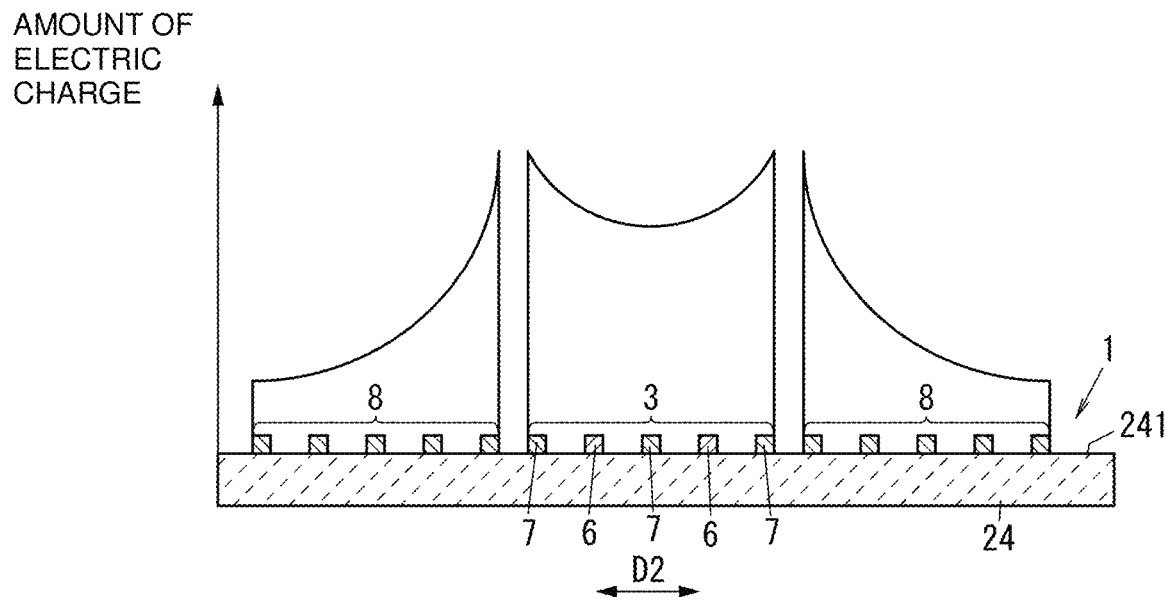
FIG. 5 is a view showing an electric charge distribution in the above acoustic wave device.
Figure 6:
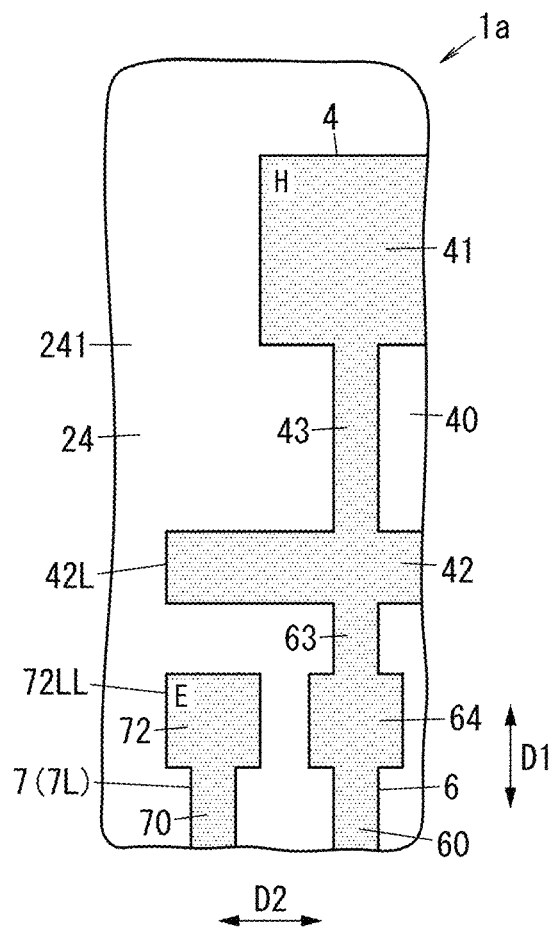
FIG. 6 is an enlarged view of a main portion of an acoustic wave device according to a first modification of the first preferred embodiment of the present invention.

FIG. 5 shows an electric charge distribution in the surface (including the surface of the interdigital transducer electrode 3 and the one main surface 241 of the piezoelectric body portion 24) of the acoustic wave device 1 according to the first preferred embodiment. A precondition for the electric charge distribution shown in FIG. 5 includes a condition that an excitation phenomenon of surface acoustic waves is occurring in the region associated with the interdigital transducer electrode 3, a condition that each reflector 8 is electrically short-circuited (short-circuited grating), and a condition that no excitation phenomenon of surface acoustic waves is occurring in the regions associated with the reflectors 8 (since the reflectors 8 are electrically short-circuited, a driving voltage that causes a piezoelectric effect is zero). Here, the principle that the electric charge distribution shown in FIG. 5 occurs is as follows. An edge effect (also referred to as cut-edge effect) occurs in a boundary region between a region where excitation of surface acoustic waves is occurring and a region where no excitation is occurring. Because of the edge effect, the amount of electric charge in a boundary region locally increases as compared to the amount of electric charge in regions around the boundary region. Therefore, in the acoustic wave device 1, the electric charge distribution as shown in FIG. 5 occurs.

As is apparent from FIG. 5, in the acoustic wave device 1, in the second direction D2 in which a group of electrode fingers including the plurality of first electrode fingers 6 and the plurality of second electrode fingers 7 is provided, the amount of electric charge at each end of the interdigital transducer electrode 3 is greater than the amount of electric charge in the center of the interdigital transducer electrode 3. In the direction along the second direction D2, the amount of electric charge at an end, closer to the interdigital transducer electrode 3, of each reflector 8 is greater than the amount of electric charge at an end away from the interdigital transducer electrode 3. Accordingly, in the acoustic wave device 1, for example, the density of electric lines of force tends to increase between the outer busbar portion 41 having a relatively higher potential between the two outer busbar portions 41, 51 and the reflector 8 adjacent to the outer busbar portion 41.

Hereinafter, for the above-described group of electrode fingers, the second electrode finger 7 located at the left-side end in FIG. 1 and FIG. 2A in the second direction D2 may be referred to as second electrode finger 7L, and the second electrode finger located at the right-side end in FIG. 1 and FIG. 2A may be referred to as second electrode finger 7R.

In the interdigital transducer electrode 3, of the inner busbar portion 42 of the first busbar 4 and the inner busbar portion 52 of the second busbar 5, the inner busbar portion 42 of the first busbar 4 is close to the second electrode fingers 7L, 7R. The outer busbar portion 41 different in potential from the second electrode fingers 7L, 7R is located on an inner side in the second direction D2 relative to the center portion 70, in the first direction D1, of the second electrode finger 7L located at one end and the center portion 70, in the first direction D1, of the second electrode finger 7R located at the other end of the above-described group of electrode fingers.

Figure 3:
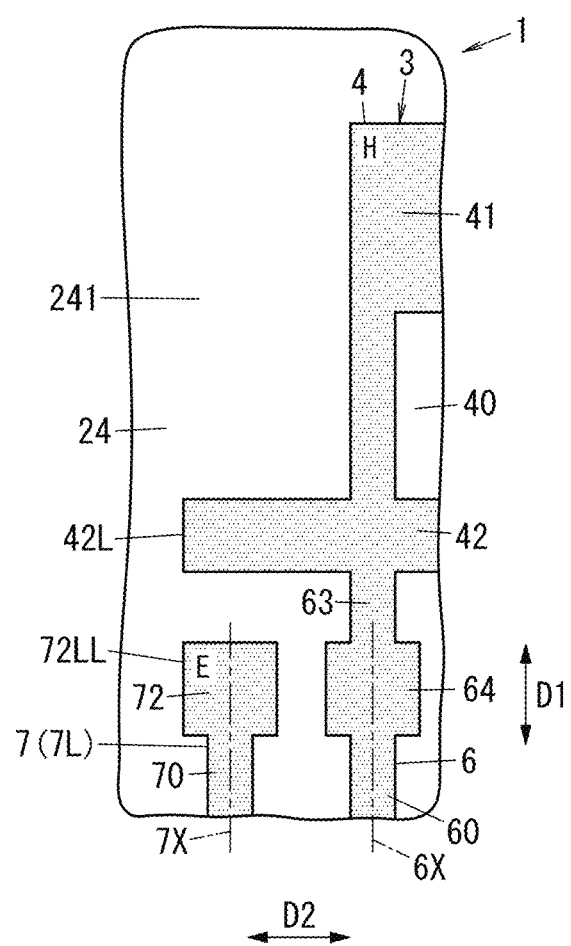
FIG. 3 is an enlarged view of a main portion of the above acoustic wave device.

In FIG. 3, for the sake of convenience of description, in the interdigital transducer electrode 3, the label "H" is assigned to the portion (high potential portion) electrically connected to the first terminal 11, and the label "E" is assigned to the portion (low potential portion) electrically connected to the second terminals 12. The high potential portion is different in potential from the low potential portion. The high potential portion is a portion higher in potential than the low potential portion. The labels "H", "E" are not signs and are not actually present. FIG. 3 is an enlarged view including the second electrode finger 7 located at the left-side end in FIG. 1 and FIG. 2A and the inner busbar portion 42 close to this second electrode finger 7. In FIG. 1 and FIG. 2A, the high potential portions (first conductive portions including the first busbar 4 and the plurality of first electrode fingers 6) to which the label "H" is assigned are different in potential from low potential portions (second conductive portions including the second busbar 5 and the plurality of second electrode fingers 7) to which the label "E" is assigned.

(1.4) Advantageous Effects

The acoustic wave device 1 according to the first preferred embodiment includes the first terminal 11, the second terminals 12, the piezoelectric body portion 24, the interdigital transducer electrode 3, and the reflectors 8. Each second terminal has a lower potential than the first terminal 11. The interdigital transducer electrode 3 is provided on or above the piezoelectric body portion 24, and electrically connected to the first terminal 11 and the second terminals 12. The reflectors 8 are provided on or above the piezoelectric body portion 24 and electrically connected to the second terminals 12. The interdigital transducer electrode 3 includes the first busbar 4, the second busbar 5, the plurality of first electrode fingers 6, and the plurality of second electrode fingers 7. The first busbar 4 is electrically connected to the first terminal 11. The second busbar 5 is opposed to the first busbar 4 in the first direction D1 and electrically connected to the second terminals 12. The plurality of first electrode fingers 6 are connected to the first busbar 4 and have a greater width from the first busbar 4 toward the second busbar 5 in the first direction D1. The plurality of second electrode fingers 7 are connected to the second busbar 5 and have a greater width from the second busbar 5 toward the first busbar 4 in the first direction D1. The plurality of first electrode fingers 6 and the plurality of second electrode fingers 7 are provided alternately one by one and spaced apart from each other in the second direction D2 perpendicular or substantially perpendicular to the first direction D1. At least one electrode finger (first electrode finger 6) of the plurality of first electrode fingers 6 includes the wide portion 62 having a greater width in the second direction D2 than the center portion 60, in the first direction D1, of the at least one electrode finger (first electrode finger 6). At least one electrode finger (second electrode finger 7) of the plurality of second electrode fingers 7 includes the wide portion 72 having a greater width in the second direction D2 than the center portion 70, in the first direction D1, of the at least one electrode finger (second electrode finger 7). The first busbar 4 includes the opening portions 40, the inner busbar portion 42, the outer busbar portion 41, and the coupling portions 43. The second busbar 5 includes the opening portions 50, the inner busbar portion 52, the outer busbar portion 51, and the coupling portions 53. The inner busbar portion 42 is located closer to the plurality of first electrode fingers 6 and the plurality of second electrode fingers 7 than the opening portions in the first direction D1. The inner busbar portion 52 is located closer to the plurality of first electrode fingers 6 and the plurality of second electrode fingers 7 than the opening portions 50 in the first direction D1. The outer busbar portion 41 is located across the opening portions 40 from the inner busbar portion 42 in the first direction D1. The outer busbar portion 51 is located across the opening portions 50 from the inner busbar portion 52 in the first direction D1. The coupling portions 43 couple the inner busbar portion 42 and the outer busbar portion 41 in the first direction D1. The coupling portions 53 couple the inner busbar portion 52 and the outer busbar portion 51 in the first direction D1. In the interdigital transducer electrode 3, where, of the group of electrode fingers including the plurality of first electrode fingers 6 and the plurality of second electrode fingers 7, the electrode finger (the second end electrode finger 7L or the second end electrode finger 7R) located at one end in the second direction D2 is a first end electrode finger and the electrode finger (the second end electrode finger 7R or the second end electrode finger 7L) located at the other end is a second end electrode finger, the first end electrode finger is located between the reflector 8 and the second end electrode finger in the second direction D2.

The outer busbar portion (outer busbar portion 41) of one (first busbar 4) of the first busbar 4 and the second busbar 5, not connected to the first end electrode finger, is located on an inner side in the second direction D2 relative to the center portion (center portion 70), in the first direction D1, of the first end electrode finger.

Thus, with the acoustic wave device 1 according to the first preferred embodiment, the interdigital transducer electrode 3 includes the above-described features, such that interference with a piston mode is significantly reduced or prevented. In addition, with the acoustic wave device 1 according to the first preferred embodiment, for the outer busbar portion 41 not connected to the second electrode fingers 7L, 7R, surge breakdown due to ESD between the outer busbar portion 41 and the reflectors 8 is less likely to occur, so significant improvement in ESD tolerance is provided. Thus, with the acoustic wave device 1 according to the first preferred embodiment, ESD tolerance is significantly improved while interference with a piston mode is significantly reduced or prevented.

The acoustic wave device 1 according to the first preferred embodiment includes the two reflectors 8. The reflectors are provided one by one on both sides of the interdigital transducer electrode 3 in the second direction D2. In the acoustic wave device 1 according to the first preferred embodiment, the outer busbar portion 41 of the first busbar 4 not connected to the second electrode fingers 7L, 7R is located on an inner side in the second direction D2 relative to the wide portions 72 of the second electrode finger 7L and the wide portion 72 of the second electrode finger 7R. Thus, with the acoustic wave device 1, surge breakdown is less likely to occur and ESD tolerance significantly improves as compared to when the wide portion 72 of the second electrode finger 7L and the outer busbar portion 41 overlap in the first direction D1.

In the acoustic wave device 1, the outer busbar portion 41 is located on an inner side in the second direction D2 relative to the second electrode finger 7L and the second electrode finger 7R and does not overlap the second electrode finger 7L or the second electrode finger 7R in the first direction D1. Thus, with the acoustic wave device 1, the shortest distance between the outer busbar portion 41 and each reflector 8 is have a greater width, so ESD tolerance is further improved.

In the acoustic wave device 1, one (left in the second direction D2) side 42L, along the first direction D1, of the inner busbar portion 42 of the first busbar 4 not connected to the second electrode fingers 7L, 7R and a (left) side 72LL, away from the second electrode finger 7R, of the wide portion 72 of the second electrode finger 7L are aligned in a straight line or substantially in a straight line, and the other (right in the second direction D2) side 42R, along the first direction D1, of the inner busbar portion 42 and a (right) side 72RR, away from the second electrode finger 7L, of the wide portion 72 of the second electrode finger 7R are aligned in a straight line or substantially in a straight line. Thus, with the acoustic wave device 1, ESD tolerance is significantly improved by changing only the shape of the outer busbar portion 41 without changing the shape of the inner busbar portion 42, so ESD tolerance is further improved while interference with a piston mode is significantly reduced or prevented.

In the interdigital transducer electrode 3, of the group of electrode fingers including the plurality of first electrode fingers 6 and the plurality of second electrode fingers 7, the outer busbar portion 41 of the first busbar 4 not connected to the second electrode finger 7L located at one end in the second direction D2 or the second electrode finger 7R located at the other end is located on an inner side in the second direction D2 relative to the inner busbar portion 42 close to the second electrode fingers 7L, 7R respectively located at both ends in the second direction D2.

Thus, with the acoustic wave device 1 according to the first preferred embodiment, the outer busbar portion 41 of the first busbar 4 not connected to the second electrode finger 7L or the second electrode finger 7R is able to significantly reduce or prevent surge breakdown due to ESD. Thus, with the acoustic wave device 1 according to the first preferred embodiment, ESD tolerance is significantly improved.

(1.5) First Modification of First Embodiment

In an acoustic wave device 1a according to a first modification of the first preferred embodiment shown in FIG. 5, the left side of the outer busbar portion 41 and the right side of the wide portion 72 of the second electrode finger 7L are aligned in a straight line or substantially in a straight line. In addition, the right side of the outer busbar portion 41 and the left side of the wide portion 72 of the second electrode finger 7R (see FIG. 2A) are aligned in a straight line or substantially in a straight line. Other features of the acoustic wave device 1a according to the first modification are the same as or similar to those of the acoustic wave device 1 according to the first preferred embodiment, so the drawings and description thereof are omitted.

With the acoustic wave device 1a according to the first modification, the length of the outer busbar portion 41 in the second direction D2 is increased as compared to the acoustic wave device 1 according to the first preferred embodiment, such that interference with a piston mode is further reduced or prevented.

(1.6) Other Modifications of First Embodiment

The number of the plurality of first electrode fingers 6 and the number of the plurality of second electrode fingers 7 in the interdigital transducer electrode 3 are not limited. Here, in the interdigital transducer electrode 3, the electrode fingers respectively located at both ends in the second direction D2 of the group of electrode fingers are not limited to the second electrode fingers 7. For example, of the group of electrode fingers, the electrode finger located at one end in the second direction D2 may be the second electrode finger 7, and the electrode finger located at the other end may be the first electrode finger 6. Accordingly, the inner busbar portion 42 of the first busbar 4 is close to the second electrode finger 7 located at one end, and the inner busbar portion 52 of the second busbar 5 is close to the first electrode finger 6 located at the other end. Of the group of electrode fingers, the electrode fingers respectively located at one end and the other end in the second direction D2 may be the first electrode fingers 6. Accordingly, the inner busbar portion 52 of the second busbar 5 is close to the first electrode fingers 6 respectively located at one end and the other end. The group of electrode fingers only needs to include the plurality of first electrode fingers 6 and the plurality of second electrode fingers 7 spaced apart from each other in the second direction D2 perpendicular or substantially perpendicular to the first direction D1. For example, in an acoustic wave device of one modification, a region in which the first electrode finger 6 and the second electrode finger 7 are provided one by one and spaced apart from each other and a region in which the two first electrode fingers 6 or the two second electrode fingers 7 are provided in the second direction D2 may be mixed. With the acoustic wave device of any one of these modifications as well, the outer busbar portion not connected to at least one electrode finger of the two electrode fingers respectively located one by one at one end and the other end in the second direction D2 of the group of electrode fingers is located on an inner side in the second direction D2 relative to the center portion, in the first direction D1, of the at least one electrode finger, ESD tolerance is significantly improved. At least one first electrode finger 6 of the plurality of first electrode fingers 6 in the interdigital transducer electrode 3 only needs to include the wide portion 62, and at least one second electrode finger 7 of the plurality of second electrode fingers 7 in the interdigital transducer electrode 3 only needs to include the wide portion 72.

In the interdigital transducer electrode 3, of the group of electrode fingers, at least one electrode finger may have three or more wide portions.

The acoustic wave device 1 may further include an electrically conductive first bump provided on or above the first terminal 11 and an electrically conductive second bump provided on or above each of the second terminals 12. The number of the second terminals 12 is not limited to a multiple number and may be, for example, one.

Second Preferred Embodiment (2.1) Overall Configuration of Acoustic Wave Device

Hereinafter, an acoustic wave device 1b according to a second preferred embodiment of the present invention will be described with reference to the drawings.

Figure 7:
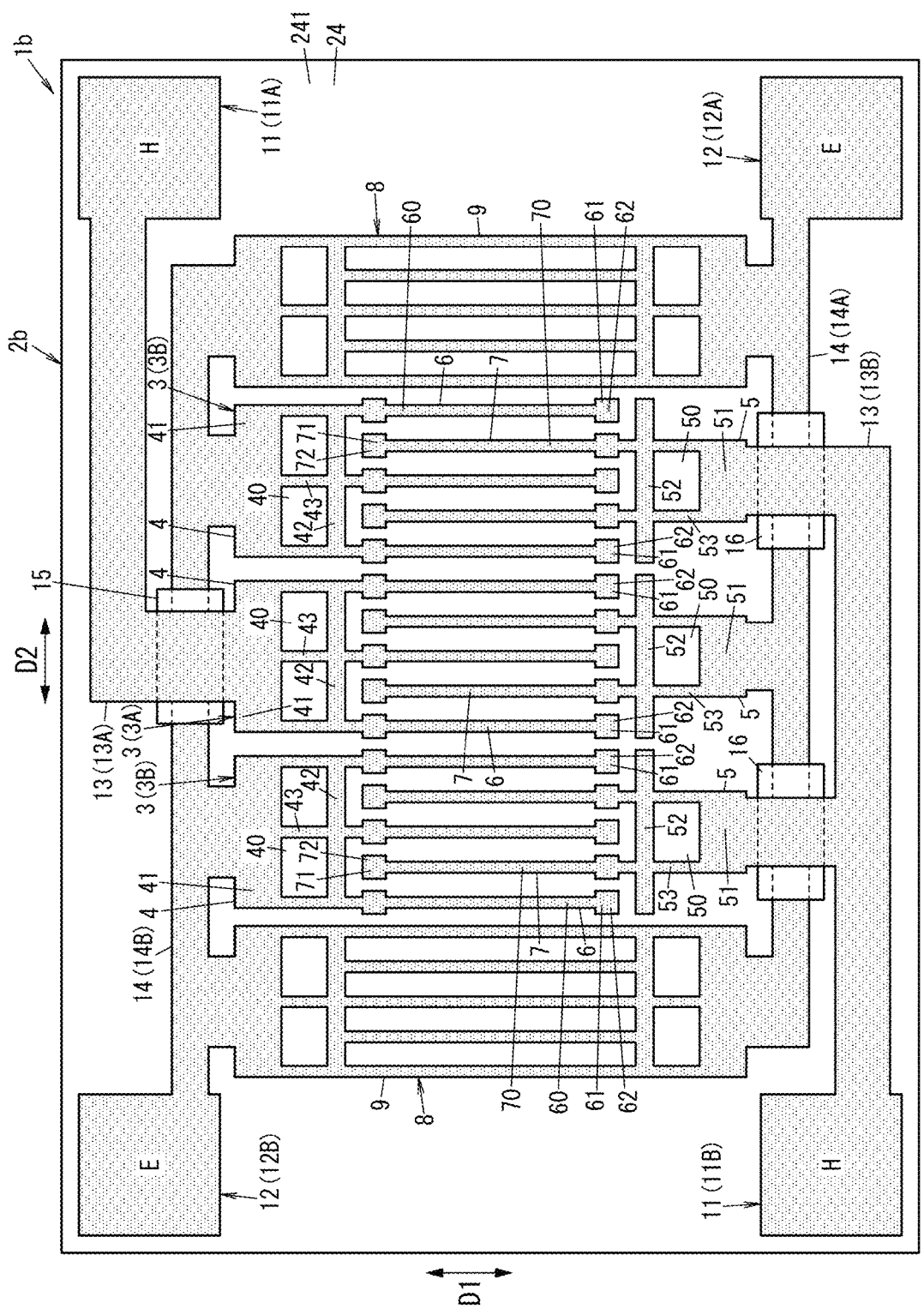
FIG. 7 is a plan view of an acoustic wave device according to a second preferred embodiment of the present invention.
Figure 8:
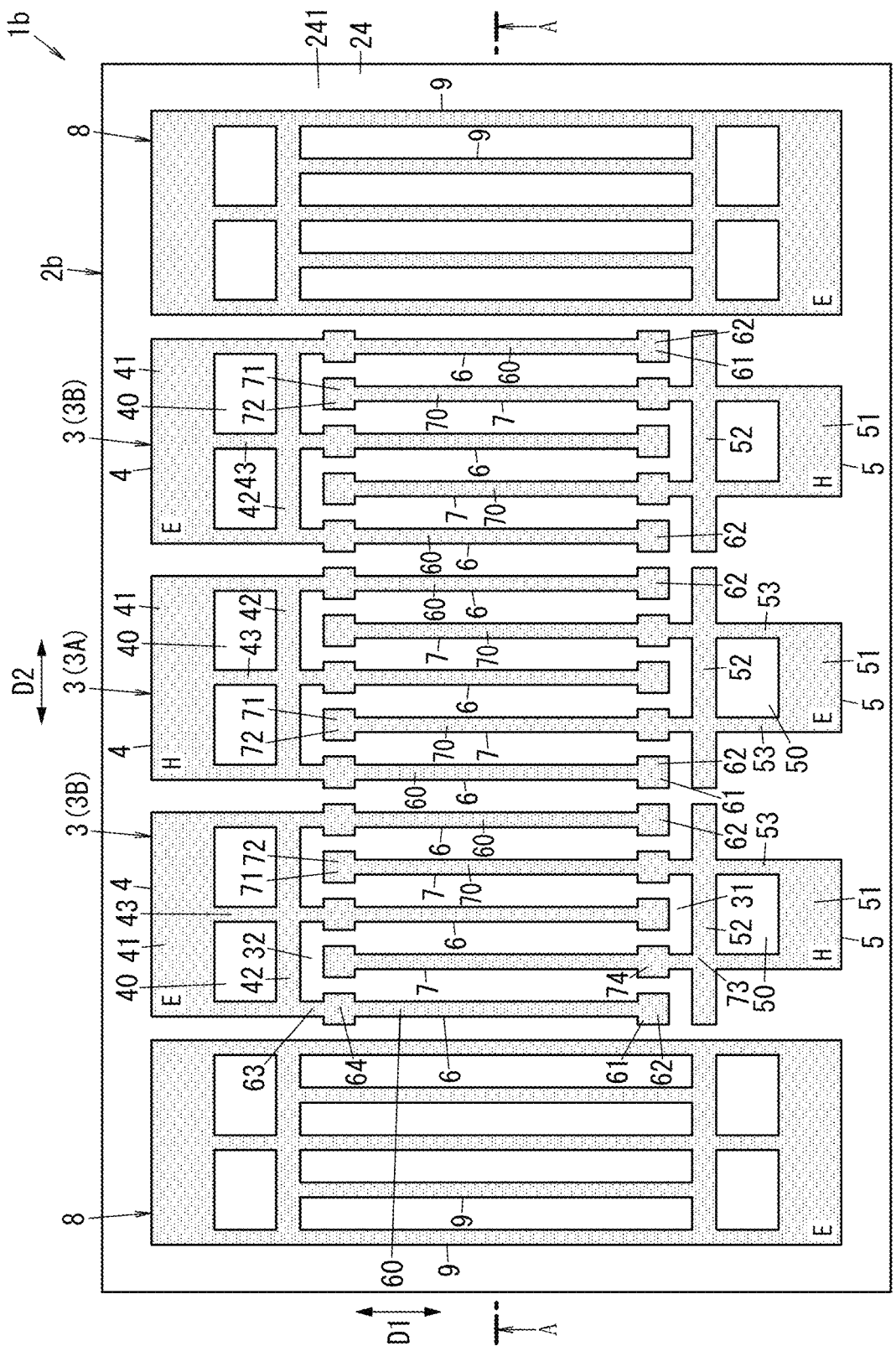
FIG. 8 is a plan view of a portion of the acoustic wave device according to the second preferred embodiment of the present invention.
Figure 9:
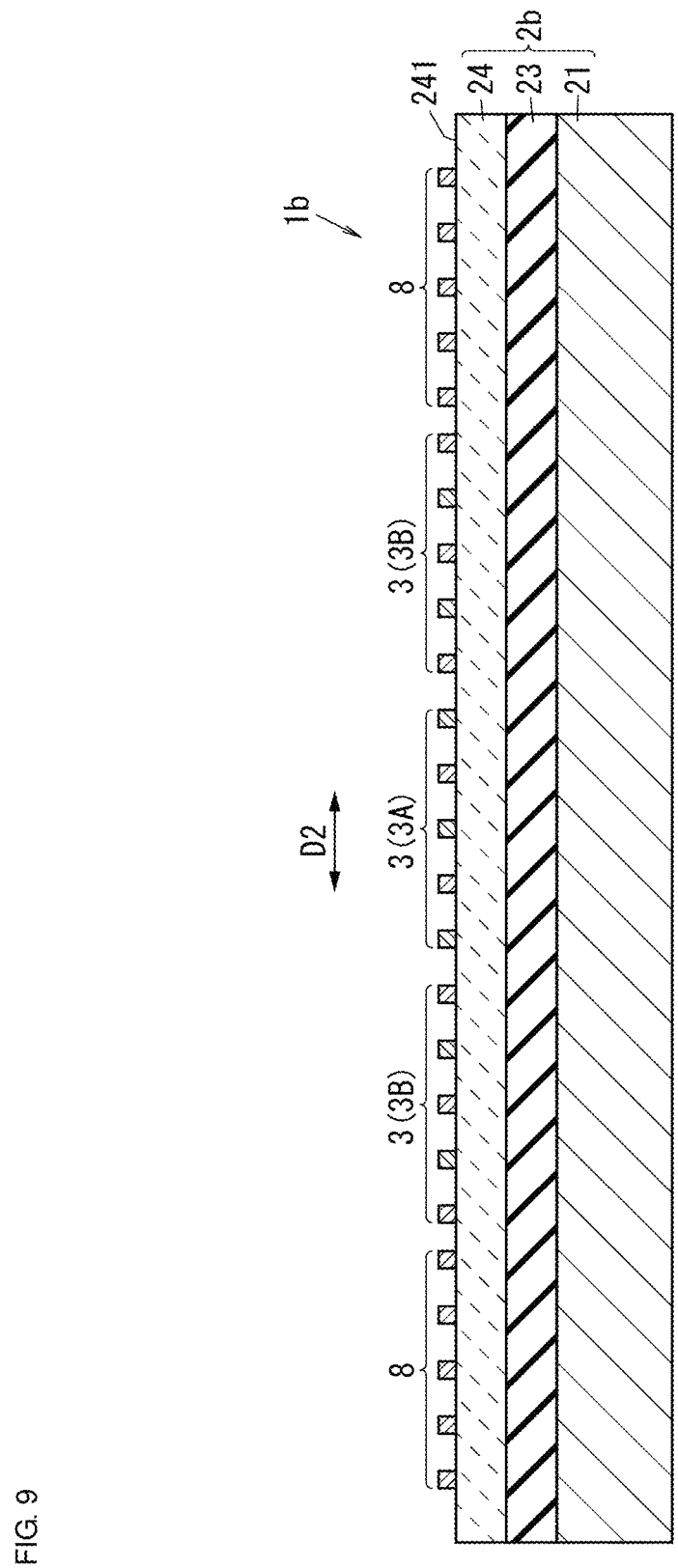
FIG. 9 relates to the above acoustic wave device and is a cross-sectional view taken along the line A-A in FIG. 8.

The acoustic wave device 1b according to the second preferred embodiment is a longitudinally coupled resonator filter, and, as shown in FIG. 7 to FIG. 10, includes the first terminals (for example, signal terminals) 11, the second terminals (for example, ground terminals) 12, the piezoelectric body portion 24, and a plurality of the interdigital transducer electrodes 3. The piezoelectric body portion 24 is made of a piezoelectric material. The plurality of interdigital transducer electrodes 3 is provided on or above the piezoelectric body portion 24. The acoustic wave device 1b according to the second preferred embodiment further includes the two reflectors 8. In FIG. 7 and FIG. 8, dot hatching is applied to the plurality of interdigital transducer electrodes 3 and the reflectors 8. These hatchings do not represent cross sections and are provided to clearly show the relationship among the plurality of interdigital transducer electrodes 3, the reflectors 8, and the piezoelectric body portion 24. As for the acoustic wave device 1b according to the second preferred embodiment, like reference numerals denote similar components to those of the acoustic wave device 1 (see FIG. 1 to FIG. 4) according to the first preferred embodiment, and the description thereof may be omitted.

(2.2) Components of Acoustic Wave Device

Next, the components of the acoustic wave device 1b will be described with reference to the drawings.

(2.2.1) Multilayer Board

In the acoustic wave device 1b according to the second preferred embodiment, the piezoelectric body portion 24 is a piezoelectric film, and the plurality of interdigital transducer electrodes 3 is provided on or above a multilayer board 2b including the piezoelectric body portion 24. The plan-view shape (the outer peripheral shape of the high acoustic velocity support substrate 21 when viewed in the thickness direction) of the high acoustic velocity support substrate 21 (see FIG. 9) in the multilayer board 2b is a rectangular or substantially rectangular shape, for example. However, the shape is not limited to a rectangular or substantially rectangular shape and may be, for example, a square or substantially square shape.

(2.2.2) Reflector

The two reflectors 8 are provided on or above the piezoelectric body portion 24. Here, the two reflectors 8 each are provided one by one across the interdigital transducer electrode 3 at any one of both sides of the three interdigital transducer electrodes 3 in the second direction D2 from the center interdigital transducer electrode 3. Hereinafter, for the sake of convenience of description, when the three interdigital transducer electrodes 3 are distinguished from one another, of the plurality of interdigital transducer electrodes 3, one of the adjacent two interdigital transducer electrodes 3 in the second direction D2 may be referred to as first interdigital transducer electrode 3A and the other may be referred to as second interdigital transducer electrode 3B. In the example of FIG. 7 and FIG. 8, of the three interdigital transducer electrodes 3, the center interdigital transducer electrode 3 is referred to as first interdigital transducer electrode 3A, and the interdigital transducer electrodes 3 at both ends are referred to as second interdigital transducer electrodes 3B.

(2.2.3) Interdigital Transducer Electrode

In the acoustic wave device 1b according to the second preferred embodiment, the three interdigital transducer electrodes 3 are provided in the second direction D2. Each of the three interdigital transducer electrodes 3 includes the first busbar 4, the second busbar 5, the plurality of first electrode fingers 6, and the plurality of second electrode fingers 7.

The first busbar 4 includes the opening portions 40, the inner busbar portion 42, the outer busbar portion 41, and the coupling portions 43. The second busbar 5 includes the opening portions 50, the inner busbar portion 52, the outer busbar portion 51, and the coupling portions 53. In the interdigital transducer electrode 3, the wide portions 62 of the distal end portions 61 of the plurality of first electrode fingers 6 and the wide portions 74, closer to the proximal end portions 73, of the second electrode fingers 7 are provided alternately one by one and spaced apart from each other in the second direction D2. In addition, in the interdigital transducer electrode 3, the wide portions 64, closer to the proximal end portions 63, of the plurality of first electrode fingers 6 and the wide portions 72 of the distal end portions 71 of the second electrode fingers 7 are provided alternately one by one and spaced apart from each other in the second direction D2.

(2.3) Potential of Interdigital Transducer Electrode

In FIG. 7 and FIG. 8, for the sake of convenience of description, the label "H" is assigned to portions (high potential portions) electrically connected to the first terminals (signal terminals) 11 in the interdigital transducer electrodes 3, and the label "E" is assigned to portions (low potential portions) electrically connected to the second terminals (ground terminals) 12 in the interdigital transducer electrodes 3 and the reflectors 8. The high potential portions are different in potential from the low potential portions. The high potential portions are portions higher in potential than the low potential portions. The labels "H", "E" are not signs and are not actually present.

The acoustic wave device 1b includes the two first terminals 11 and the two second terminals 12. When the two first terminals 11 are distinguished from each other, one is referred to as first terminal 11A, and the other is referred to as first terminal 11B. When the two second terminals 12 are distinguished from each other, one is referred to as second terminal 12A, and the other is referred to as second terminal 12B.

The first busbar 4 of the first interdigital transducer electrode 3A is electrically connected to the first terminal 11A. The acoustic wave device 1b includes the first wiring layer 13 (13A) that electrically connects the first terminal 11A and the first busbar 4 of the first interdigital transducer electrode 3A. The second busbar 5 of the first interdigital transducer electrode 3A is electrically connected to the second terminal 12A and the second terminal 12B. The acoustic wave device 1b includes the second wiring layer 14 (14A) that electrically connects the second terminal 12A, the second terminal 12B, and the second busbar 5 of the first interdigital transducer electrode 3A. In the first interdigital transducer electrode 3A, the second busbar 5 has a lower potential than the first busbar 4.

The first busbar 4 of each second interdigital transducer electrode 3B is electrically connected to the second terminal 12B. The acoustic wave device 1b includes the second wiring layer 14 (14B) that electrically connects the second terminal 12B and the first busbar 4 of each second interdigital transducer electrode 3B. The second busbar 5 of each second interdigital transducer electrode 3B is electrically connected to the first terminal 11B. The acoustic wave device 1b includes the first wiring layer 13 (13B) that electrically connects the first terminal 11B and the second busbar 5 of each second interdigital transducer electrode 3B. In each second interdigital transducer electrode 3B, the first busbar 4 has a lower potential than the second busbar 5.

Each reflector 8 is electrically connected to the second terminal 12A and the second terminal 12B. Each reflector 8 has a lower potential than the second busbar 5 of each second interdigital transducer electrode 3B.

The acoustic wave device 1b includes an electrically insulating layer 15 that electrically insulates the first wiring layer 13 (13A) and the second wiring layer 14 (14B) from each other. The electrically insulating layer 15 is provided on or above the piezoelectric body portion 24 and partially interposed between the first wiring layer 13 (13A) and the second wiring layer (14B). The acoustic wave device 1b includes an electrically insulating layer 16 that electrically insulates the first wiring layer 13 (13B) and the second wiring layer 14 (14A) from each other. The electrically insulating layer 16 is provided on or above the piezoelectric body portion 24 and partially interposed between the first wiring layer 13 (13B) and the second wiring layer (14A).

The acoustic wave device 1b may further include an electrically conductive first bump provided on or above each of the first terminals 11 and an electrically conductive second bump provided on or above each of the second terminals 12. The number of the first terminals 11 and the number of the second terminals each are not limited to a multiple number and may be, for example, one.

Figure 10:
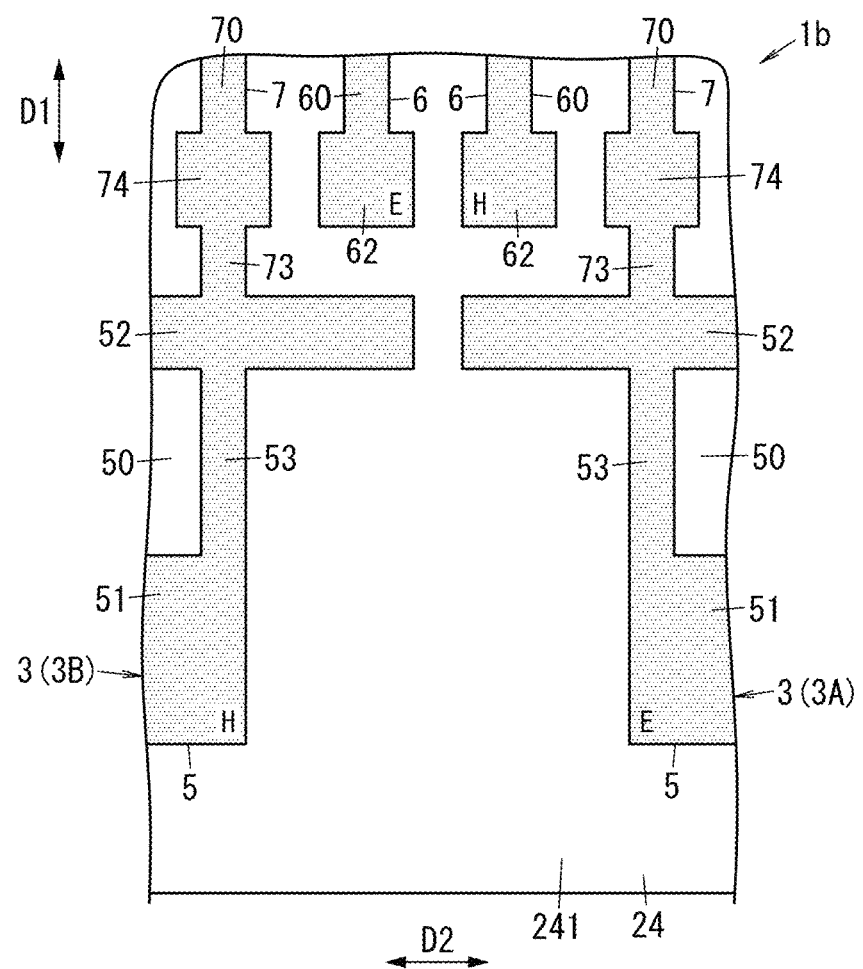
FIG. 10 is an enlarged view of a main portion of the above acoustic wave device.

FIG. 10 is an enlarged view including the first electrode finger 6 located at the left-side end of the center first interdigital transducer electrode 3A in FIG. 7 and FIG. 8 and the first electrode finger 6 located at the right-side end of the left-side second interdigital transducer electrode 3B in FIG. 7 and FIG. 8. In FIG. 7, FIG. 8, and FIG. 10, the high potential portions to which the label "H" is assigned are different in potential from the low potential portions to which the label "E" is assigned. For example, in FIG. 10, the first electrode finger 6 located at the left-side end of the first interdigital transducer electrode 3A and the first electrode finger 6 located at the right-side end of the second interdigital transducer electrode 3B are different in potential. In FIG. 10, the first electrode finger 6 located at the left-side end of the first interdigital transducer electrode 3A and the second busbar 5 of the first interdigital transducer electrode 3A, close to this first electrode finger 6, are different in potential. In FIG. 10, the first electrode finger 6 located at the right-side end of the second interdigital transducer electrode 3B and the second busbar 5 of the second interdigital transducer electrode 3B, close to this first electrode finger 6, are different in potential. The second busbar 5 of the first interdigital transducer electrode 3A and the second busbar 5 of the second interdigital transducer electrode 3B are different in potential.

Figure 11:
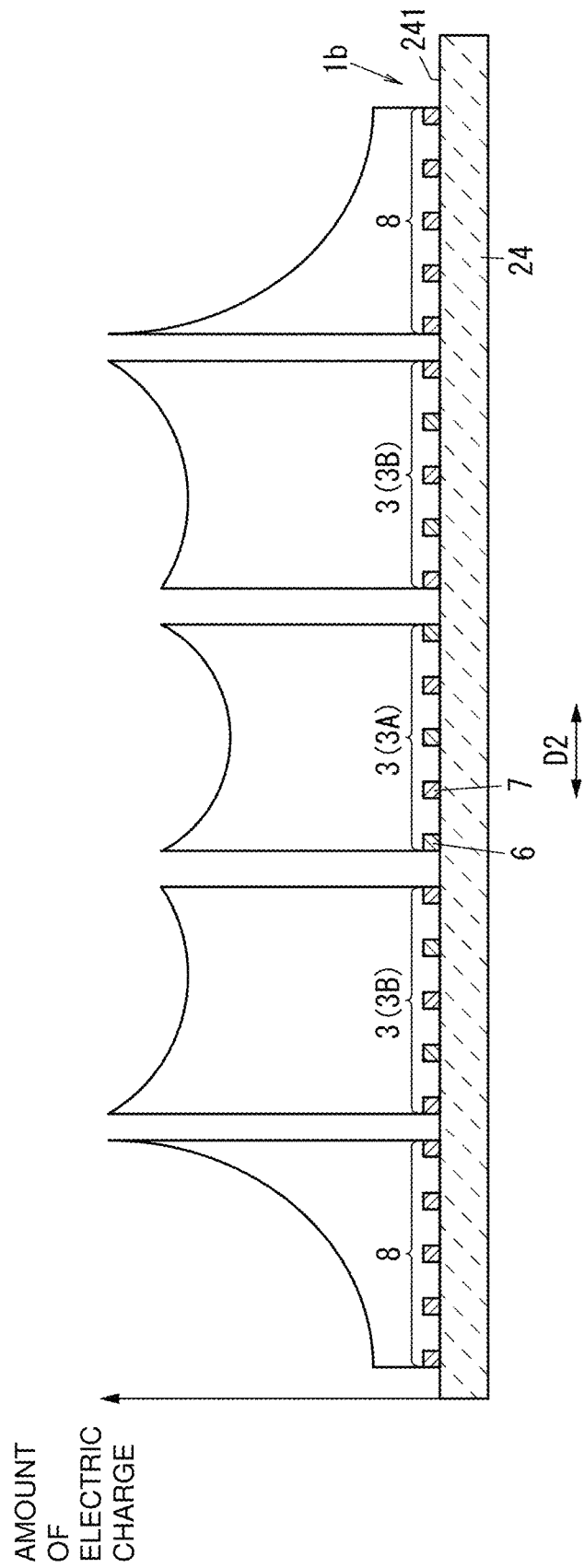
FIG. 11 is a view showing an electric charge distribution in the above acoustic wave device.

FIG. 11 shows an electric charge distribution in the surface (including the surfaces of the three interdigital transducer electrodes 3 and the one main surface 241 of the piezoelectric body portion 24) of the acoustic wave device 1b according to the second preferred embodiment. A precondition for the electric charge distribution shown in FIG. 11 includes a condition that an excitation phenomenon of surface acoustic waves is occurring in the region associated with the first interdigital transducer electrode 3A and each region associated with the second interdigital transducer electrode 3B, a condition that the region associated with the first interdigital transducer electrode 3A and each region associated with the second interdigital transducer electrode 3B are respectively connected to different electrical terminals (the first terminal 11A and the first terminal 11B), a condition that each reflector 8 is electrically short-circuited (short-circuited grating), and a condition that no excitation phenomenon of surface acoustic waves is occurring in the regions associated with the reflectors 8 (since the reflectors 8 are electrically short-circuited, a driving voltage that causes a piezoelectric effect is zero). Here, the principle that the electric charge distribution shown in FIG. 11 occurs is as follows. An edge effect (also referred to as cut-edge effect) occurs in a boundary region between a region where excitation of surface acoustic waves is occurring and a region where no excitation is occurring. An edge effect also occurs in a boundary region between two regions in which the states of excitation of surface acoustic waves are different from each other. Because of the edge effect, the amount of electric charge in a boundary region locally increases as compared to the amount of electric charge in regions around the boundary region. An edge effect, in principle, may occur in applicable various boundary regions when the states of excitation of surface acoustic waves are different from each other. However, in the case of the acoustic wave device 1b (longitudinally coupled resonator-type filter) according to the second preferred embodiment, as shown in FIG. 11, the amount of electric charge mostly locally concentrates in the boundary region between the region associated with the first interdigital transducer electrode 3A and each region associated with the second interdigital transducer electrode 3B and in the boundary region between each region associated with the second interdigital transducer electrode 3B and the region associated with the reflector 8. Therefore, in the acoustic wave device 1b according to the second preferred embodiment, the electric charge distribution as shown in FIG. 11 occurs.

As is apparent from FIG. 11, in the acoustic wave device 1b, in the second direction D2 in which a group of electrode fingers including the plurality of first electrode fingers 6 and the plurality of second electrode fingers 7 is provided, the amount of electric charge at each end of the interdigital transducer electrode 3 is greater than the amount of electric charge in the center of the interdigital transducer electrode 3. Accordingly, in the acoustic wave device 1b, for example, the density of electric lines of force tends to increase between the outer busbar portions 51 of the adjacent interdigital transducer electrodes 3. In the direction along the second direction D2, the amount of electric charge at an end, closer to the interdigital transducer electrode 3, of each reflector 8 is greater than the amount of electric charge at an end away from the interdigital transducer electrode 3. Accordingly, in the acoustic wave device 1b, for example, the density of electric lines of force tends to increase between the outer busbar portion 41 having a relatively higher potential between the two outer busbar portions 41, 51 and the reflector 8 adjacent to the outer busbar portion 41.

(2.4) Advantageous Effects

The acoustic wave device 1b according to the second preferred embodiment includes the first terminals 11, the second terminals 12, the piezoelectric body portion 24, and the plurality of interdigital transducer electrodes 3. Each second terminal 12 has a lower potential than each first terminal 11. The plurality of interdigital transducer electrodes 3 are provided on or above the piezoelectric body portion 24 and electrically connected to the first terminals 11 and the second terminals 12. Each of the plurality of interdigital transducer electrodes 3 includes the first busbar 4, the second busbar 5, the plurality of first electrode fingers 6, and the plurality of second electrode fingers 7. The second busbar 5 is opposed to the first busbar 4 in the first direction D1. The plurality of first electrode fingers 6 are connected to the first busbar 4 and have a greater width from the first busbar 4 toward the second busbar 5 in the first direction D1. The plurality of second electrode fingers 7 are connected to the second busbar 5 and have a greater width from the second busbar 5 toward the first busbar 4 in the first direction D1. The plurality of first electrode fingers 6 and the plurality of second electrode fingers 7 are provided alternately one by one and spaced apart from each other in the second direction D2 perpendicular or substantially perpendicular to the first direction D1. Each of the plurality of first electrode fingers 6 includes the wide portion 62 having a greater width in the second direction D2 than the center portion 60 in the first direction D1. Each of the plurality of second electrode fingers 7 includes the wide portion 72 having a greater width in the second direction D2 than the center portion 70 in the first direction D1. The first busbar 4 includes the opening portions 40, the inner busbar portion 42, the outer busbar portion 41, and the coupling portions 43. The second busbar 5 includes the opening portions 50, the inner busbar portion 52, the outer busbar portion 51, and the coupling portions 53. The inner busbar portion 42 is located closer to the plurality of first electrode fingers 6 and the plurality of second electrode fingers 7 than the opening portions 40 in the first direction D1. The inner busbar portion 52 is located closer to the plurality of first electrode fingers 6 and the plurality of second electrode fingers 7 than the opening portions 50 in the first direction D1. The outer busbar portion 41 is located across the opening portions 40 from the inner busbar portion 42 in the first direction D1. The outer busbar portion 51 is located across the opening portions 50 from the inner busbar portion 52 in the first direction D1. The coupling portions 43 couple the inner busbar portion 42 and the outer busbar portion 41 in the first direction D1. The coupling portions 53 couple the inner busbar portion 52 and the outer busbar portion 51 in the first direction D1. Where, of the plurality of interdigital transducer electrodes 3, one of the adjacent two interdigital transducer electrodes 3 in the second direction D2 is the first interdigital transducer electrode 3A and the other one is the second interdigital transducer electrode 3B, the distance between the outer busbar portion 51 not connected to, of the group of electrode fingers including the plurality of first electrode fingers 6 and the plurality of second electrode fingers 7, the first electrode finger 6 closest to the second interdigital transducer electrode 3B in the first interdigital transducer electrode 3A and the outer busbar portion 51 not connected to, of the group of electrode fingers including the plurality of first electrode fingers 6 and the plurality of second electrode fingers 7, the first electrode finger 6 closest to the first interdigital transducer electrode 3A in the second interdigital transducer electrode 3B is greater than the distance between the center portion 60 of the first electrode finger 6 closest to the second interdigital transducer electrode 3B in the first interdigital transducer electrode 3A and the center portion 60 of the first electrode finger closest to the first interdigital transducer electrode 3A in the second interdigital transducer electrode 3B.

Thus, with the acoustic wave device 1b according to the second preferred embodiment, surge breakdown due to ESD between the outer busbar portion 51 of the first interdigital transducer electrode 3A and the outer busbar portion 51 of the second interdigital transducer electrode 3B is significantly reduced or prevented, such that ESD tolerance is significantly improved.

In the acoustic wave device 1b according to the second preferred embodiment, for the first interdigital transducer electrode 3A, the outer busbar portion 51 is located on an inner side in the second direction D2 relative to the inner busbar portion 52. Thus, with the acoustic wave device 1b, in comparison with the case where the outer busbar portion 51 of the first interdigital transducer electrode 3A, as well as the inner busbar portion 52, overlaps in the first direction D1 each of the first electrode fingers 6 respectively located one by one at one end and the other end in the second direction D2 of the group of electrode fingers, surge breakdown is less likely to occur, such that ESD tolerance significantly improves. In the acoustic wave device 1b according to the second preferred embodiment, for the second interdigital transducer electrode 3B, the outer busbar portion 51 is located on an inner side in the second direction D2 relative to the inner busbar portion 52. Thus, with the acoustic wave device 1b, in comparison with the case where the outer busbar portion 51 of the second interdigital transducer electrode 3B, as well as the inner busbar portion 52, overlaps in the first direction D1 each of the first electrode fingers 6 respectively located one by one at one end and the other end in the second direction D2 of the group of electrode fingers, surge breakdown is less likely to occur, so ESD tolerance significantly improves.

In each of the first interdigital transducer electrode 3A and the second interdigital transducer electrode 3B of the acoustic wave device 1b according to the second preferred embodiment, the outer busbar portion 51 is located on an inner side in the second direction D2 relative to the inner busbar portion 52. In the acoustic wave device 1b, from the viewpoint of significantly reducing or preventing a transverse-mode ripple by providing a piston mode, of a state where the inner busbar portion 52 overlaps in the first direction D1 each of the first electrode fingers 6 located one by one at one end and the other end in the second direction D2 of the group of electrode fingers and a state where the outer busbar portion 51 overlaps in the first direction D1 each of the first electrode fingers 6 respectively located at both ends in the second direction D2 of the group of electrode fingers, the former one is more important. Thus, with the acoustic wave device 1b according to the second preferred embodiment, ESD tolerance is significantly improved while interference with a piston mode is significantly reduced or prevented. With the acoustic wave device 1b, of the inner busbar portion 52 and the outer busbar portion 51, only the inner busbar portion 52 overlaps in the first direction D1 each of the first electrode fingers 6 located one by one at one end and the other end in the second direction D2 of the group of electrode fingers, so ESD tolerance is further improved while interference with a piston mode is significantly reduced or prevented.

(2.5) First Modification of Second Embodiment

Figure 12:
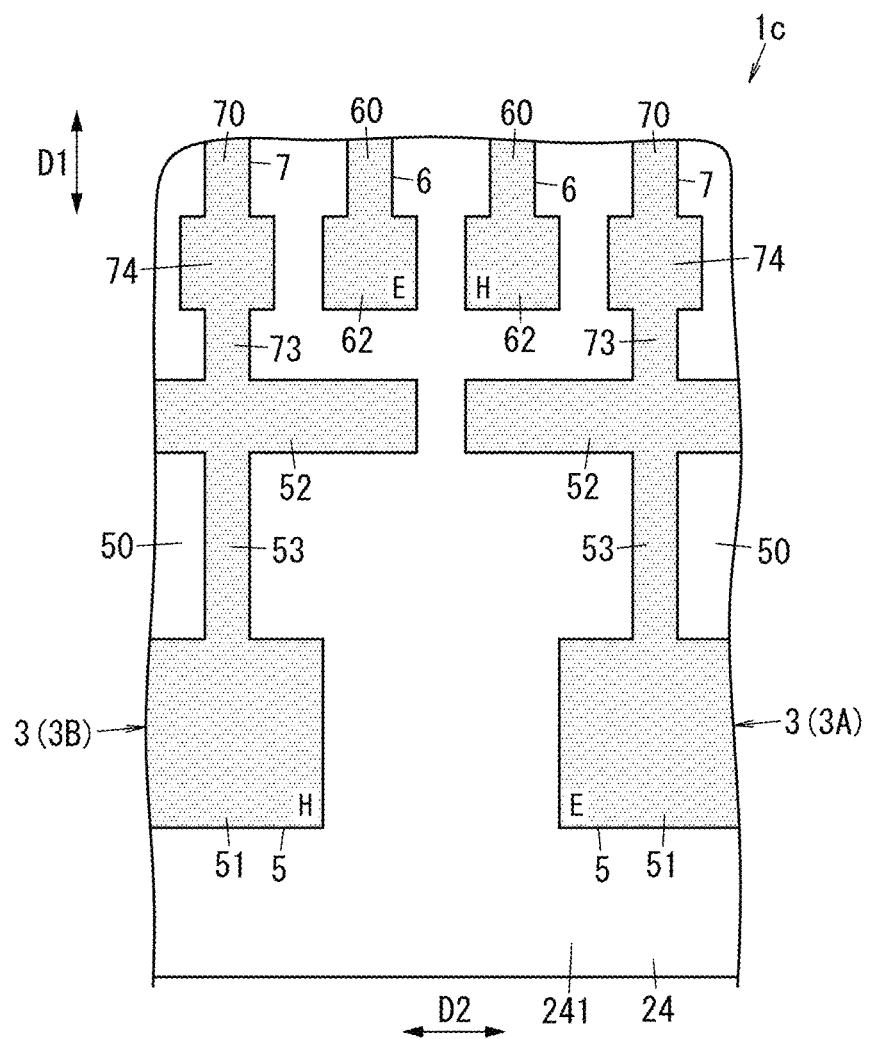
FIG. 12 is an enlarged view of a main portion of an acoustic wave device according to a first modification of the second preferred embodiment of the present invention.

An acoustic wave device 1c according to a first modification of the second preferred embodiment shown in FIG. 12 differs from the acoustic wave device 1b according to the second preferred embodiment in that the length of the outer busbar portion 51 in each of the plurality of interdigital transducer electrodes 3 is greater than that in the acoustic wave device 1b according to the second preferred embodiment. The other features of the acoustic wave device 1c according to the first modification are the same as or similar to that of the acoustic wave device 1b according to the second preferred embodiment, so the drawings and description thereof are omitted.

In the acoustic wave device 1c according to the first modification, the distance between the inner busbar portions 52 of the adjacent two interdigital transducer electrodes 3 is the same or substantially the same as the distance between sides close to each other in the adjacent wide portions 62 in the adjacent two interdigital transducer electrodes 3. In the acoustic wave device 1c according to the first modification, the distance between the outer busbar portions 51 of the adjacent two interdigital transducer electrodes 3 is the same or substantially the same as the distance between sides opposite from the sides adjacent to or in a vicinity of each other in the adjacent wide portions 62 in the adjacent two interdigital transducer electrodes 3.

In the acoustic wave device 1c, a side, closer to the second interdigital transducer electrode 3B, of the outer busbar portion 51 of the first interdigital transducer electrode 3A and a side, closer to the second electrode finger 7, of the wide portion 62 of the first electrode finger 6 closest to the second interdigital transducer electrode 3B of the above-described group of electrode fingers of the first interdigital transducer electrode 3A are aligned in a straight line or substantially in a straight line. In the acoustic wave device 1c, a side, closer to the first interdigital transducer electrode 3A, of the outer busbar portion 51 of the second interdigital transducer electrode 3B and a side, closer to the second electrode finger 7, of the wide portion 62 of the first electrode finger 6 closest to the first interdigital transducer electrode 3A of the above-described group of electrode fingers of the second interdigital transducer electrode 3B are aligned in a straight line or substantially in a straight line.

With the acoustic wave device 1c according to the first modification, the length of the outer busbar portion 51 is increased as compared to the acoustic wave device 1b according to the second preferred embodiment, such that interference with a piston mode is significantly reduced or prevented.

(2.6) Second Modification of Second Embodiment

Figure 13:
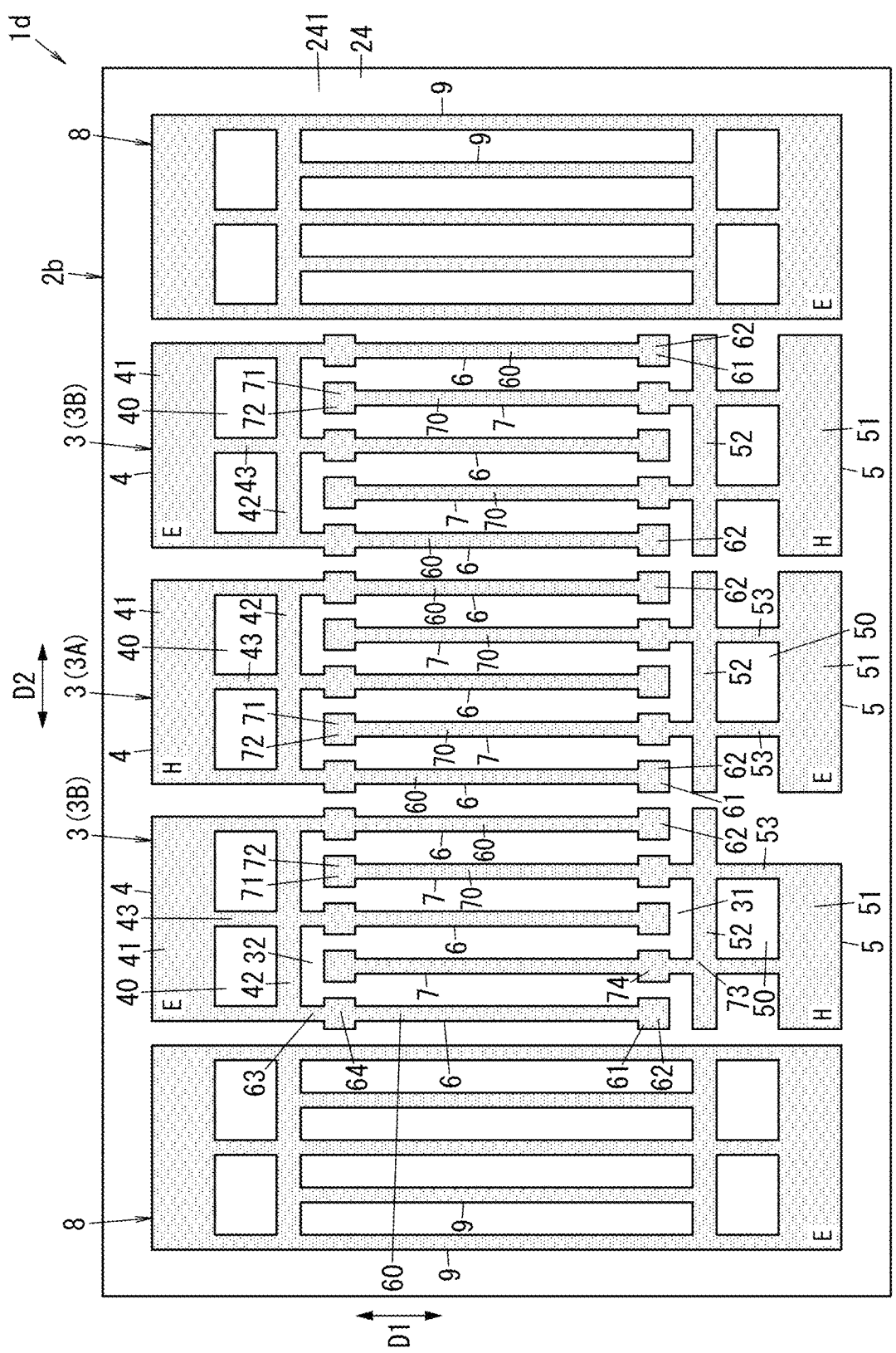
FIG. 13 is a plan view of a portion of an acoustic wave device according to a second modification of the second preferred embodiment of the present invention.
Figure 14:
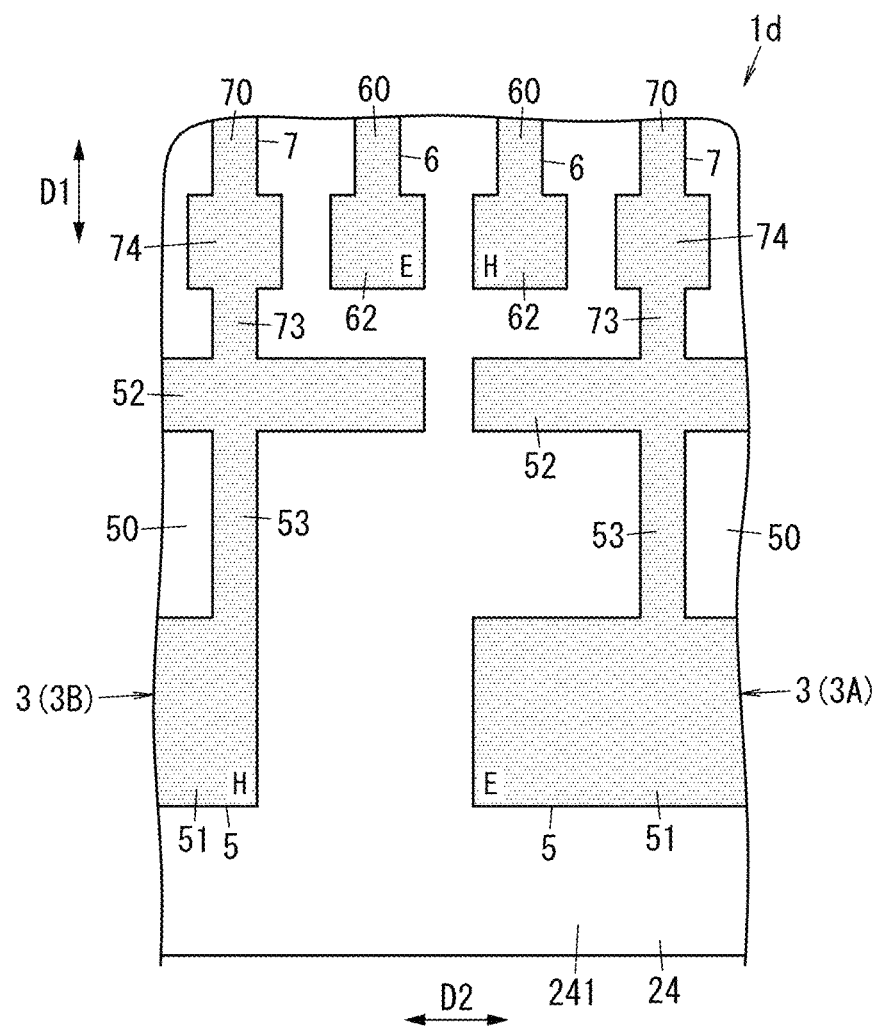
FIG. 14 is an enlarged view of a main portion of the above acoustic wave device.

As shown in FIG. 13 and FIG. 14, an acoustic wave device 1d according to a second modification of the second preferred embodiment differs from the acoustic wave device 1b (see FIG. 7 to FIG. 11) according to the second preferred embodiment in that, in only the left-side second interdigital transducer electrode 3B of the three interdigital transducer electrodes 3, the outer busbar portion 51 of the second busbar 5 is located on an inner side in the second direction D2 relative to the inner busbar portion 52 at a side closer to the first interdigital transducer electrode 3A. The other features of the acoustic wave device 1d according to the second modification are the same as or similar to that of the acoustic wave device 1b according to the second preferred embodiment, so the drawings and description thereof are omitted.

In the acoustic wave device 1d according to the second modification, in each of the center first interdigital transducer electrode 3A and the right-side second interdigital transducer electrode 3B of the three interdigital transducer electrodes 3, the outer busbar portion 51 of the second busbar 5 overlaps the inner busbar portion 52 in the first direction D1 over the entire or substantially the entire length. Here, the length of the outer busbar portion 51 is the same or substantially the same as the length of the inner busbar portion 52. In the outer busbar portion and the inner busbar portion 52, left sides in the second direction D2 are aligned in a straight line or substantially in a straight line, and right sides are aligned in a straight line or substantially in a straight line.

With the acoustic wave device 1d according to the second modification, interference with a piston mode is significantly reduced or prevented as compared to the acoustic wave device 1b according to the second preferred embodiment. In the acoustic wave device 1d according to the second modification, for the second interdigital transducer electrode 3B, the outer busbar portion 51 of the second busbar 5 is located on an inner side in the second direction D2 relative to the inner busbar portion 52 at a side closer to the first interdigital transducer electrode 3A. Thus, with the acoustic wave device 1d according to the second modification, surge breakdown due to ESD between the outer busbar portion 51 of the second interdigital transducer electrode 3B and the outer busbar portion 51 of the first interdigital transducer electrode 3A is significantly reduced or prevented, such that ESD tolerance is significantly improved.

(2.7) Third Modification of Second Embodiment

Figure 15:
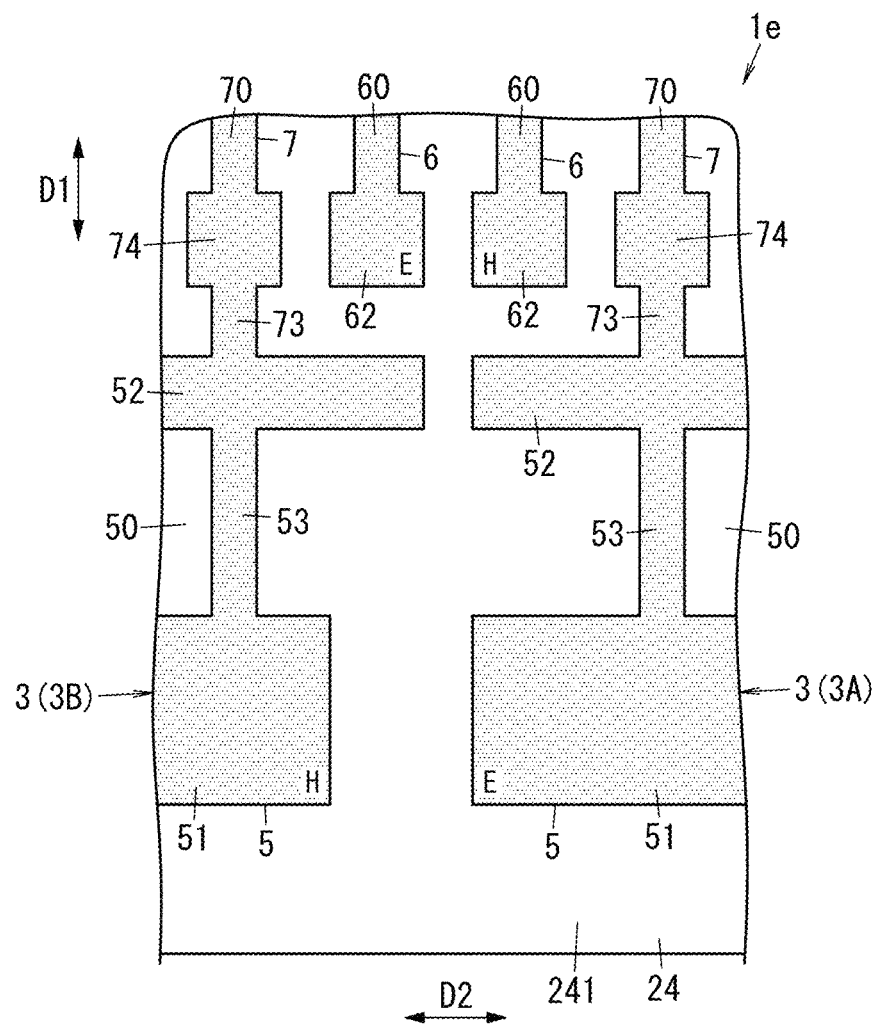
FIG. 15 is an enlarged view of a main portion of an acoustic wave device according to a third modification of the second preferred embodiment of the present invention.

An acoustic wave device 1e according to a third modification of the second preferred embodiment shown in FIG. 15 differs from the acoustic wave device 1d in that the length of the outer busbar portion 51 of the left-side second interdigital transducer electrode 3B is greater than that in the acoustic wave device 1d according to the second modification of the second preferred embodiment. The other features of the acoustic wave device 1e according to the third modification are the same as or similar to that of the acoustic wave device 1d according to the second modification of the second preferred embodiment, so the drawings and description thereof are omitted.

In the acoustic wave device 1e, a side, closer to the first interdigital transducer electrode 3A, of the outer busbar portion 51 of the left-side second interdigital transducer electrode 3B and a side, closer to the second electrode finger 7, of the wide portion 62 of the first electrode finger 6 closest to the first interdigital transducer electrode 3A of the above-described group of electrode fingers of the left-side second interdigital transducer electrode 3B are aligned in a straight line or substantially in a straight line in the first direction D1.

With the acoustic wave device 1e according to the third modification, the length of the outer busbar portion 51 of the left-side second interdigital transducer electrode 3B is increased as compared to the acoustic wave device 1d according to the second modification, such that interference with a piston mode is significantly reduced or prevented.

(2.8) Fourth Modification of Second Embodiment

Figure 16:
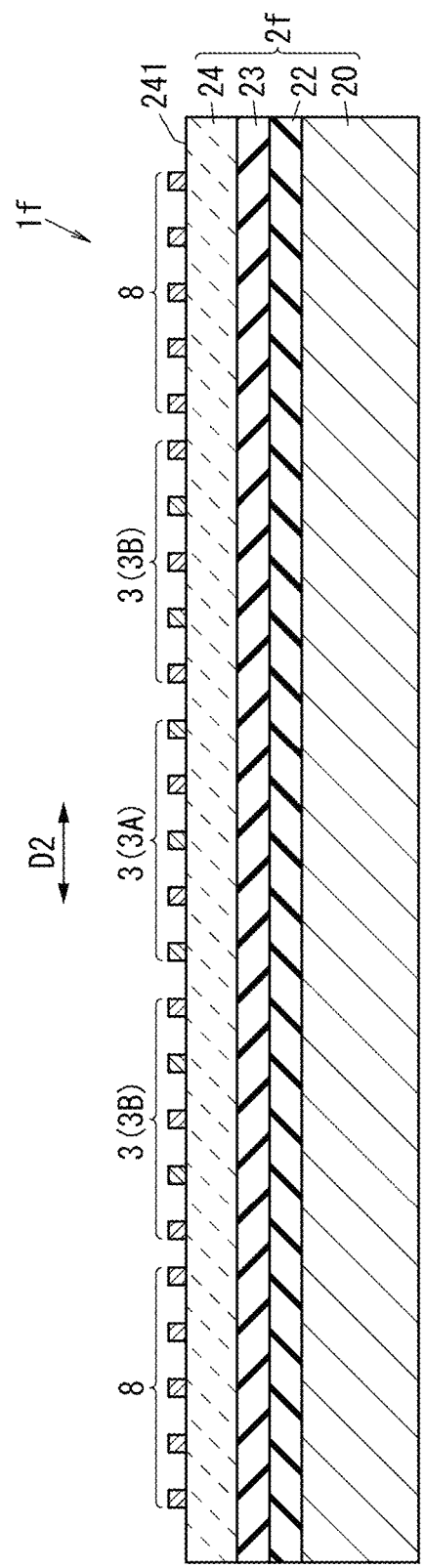
FIG. 16 is a cross-sectional view of an acoustic wave device according to a fourth modification of the second preferred embodiment of the present invention.

As shown in FIG. 16, in an acoustic wave device 1f according to a fourth modification of the second preferred embodiment, a multilayer board 2f includes a high acoustic velocity film 22, the low acoustic velocity film 23, and the piezoelectric body portion 24. The high acoustic velocity film 22 is provided on or above the support substrate 20. Here, the state "provided on or above the support substrate 20" includes the case of being directly provided on the support substrate 20 and the case of being indirectly provided on the support substrate 20. In the high acoustic velocity film 22, bulk waves propagate at a higher acoustic velocity than acoustic waves that propagate through the piezoelectric body portion (piezoelectric film) 24. The low acoustic velocity film 23 is provided on or above the high acoustic velocity film 22. Here, the state "provided on or above the high acoustic velocity film 22" includes the case of being directly provided on the high acoustic velocity film 22 and the case of being indirectly provided on the high acoustic velocity film 22. In the low acoustic velocity film 23, bulk waves propagate at a lower acoustic velocity than acoustic waves that propagate through the piezoelectric body portion 24. The piezoelectric body portion 24 is provided on or above the low acoustic velocity film 23. Here, the state "provided on or above the low acoustic velocity film 23" includes the case of being directly provided on the low acoustic velocity film 23 and the case of being indirectly provided on the low acoustic velocity film 23. As for the acoustic wave device 1f according to the fourth modification, like reference numerals denote similar components to those of the acoustic wave device 1b (see FIG. 7 to FIG. 11) according to the second preferred embodiment, and the description thereof is omitted.

The support substrate 20 may include a piezoelectric body, for example, sapphire, lithium tantalate, lithium niobate, and quartz crystal, various ceramics, for example, alumina, magnesia, silicon nitride, aluminum nitride, silicon carbide, zirconia, cordierite, mullite, steatite, and forsterite, a dielectric, for example, glass, or a semiconductor, for example, silicon and gallium nitride, a resin substrate, or the like.

In the acoustic wave device 1f according to the fourth modification, the high acoustic velocity film 22 significantly reduces or prevents acoustic waves from leaking to the structure below the high acoustic velocity film 22.

In the acoustic wave device 1f according to the fourth modification, the energy of acoustic waves in a specific mode that provides the characteristics of a filter or resonator is distributed all over the piezoelectric body portion 24 and the low acoustic velocity film 23, the energy is also distributed to a portion, closer to the low acoustic velocity film 23, of the high acoustic velocity film 22, and the energy is not distributed to the high acoustic velocity support substrate 21. Enclosing acoustic waves with the high acoustic velocity film 22 is similar to the case of enclosing surface acoustic waves of a Love wave type that is non-leaking SH (shear horizontal) waves and is, for example, described in Document "Introduction to surface acoustic wave device simulation technology", Kenya HASHIMOTO, published by Realize Inc., p. 26 to p. 28. The above-described structure that encloses acoustic waves differs from a structure that encloses acoustic waves with Bragg reflector with an acoustic multilayer film.

The high acoustic velocity film 22 is preferably made of any one of piezoelectric bodies, for example, diamond-like carbon, aluminum nitride, aluminum oxide, silicon carbide, silicon nitride, silicon, sapphire, lithium tantalate, lithium niobate, and quartz crystal, various ceramics, for example, alumina, zirconia, cordierite, mullite, steatite, and forsterite, magnesia diamond, a material including any one of the above materials as a main ingredient, and a material including a mixture of some of the above materials as a main ingredient.

For the thickness of the high acoustic velocity film 22, since the high acoustic velocity film 22 encloses acoustic waves in the piezoelectric body portion 24 and the low acoustic velocity film 23, the thickness of the high acoustic velocity film 22 is preferably thicker than the low acoustic velocity film 23, for example.

With the acoustic wave device 1f according to the fourth modification, as well as the acoustic wave device 1b (see FIG. 7 to FIG. 11) according to the second preferred embodiment, surge breakdown due to ESD between the outer busbar portion 51 of the first interdigital transducer electrode 3A and the outer busbar portion 51 of the second interdigital transducer electrode 3B is significantly reduced or prevented, so ESD tolerance is significantly improved.

(2.9) Fifth Modification of Second Embodiment

Figure 17:
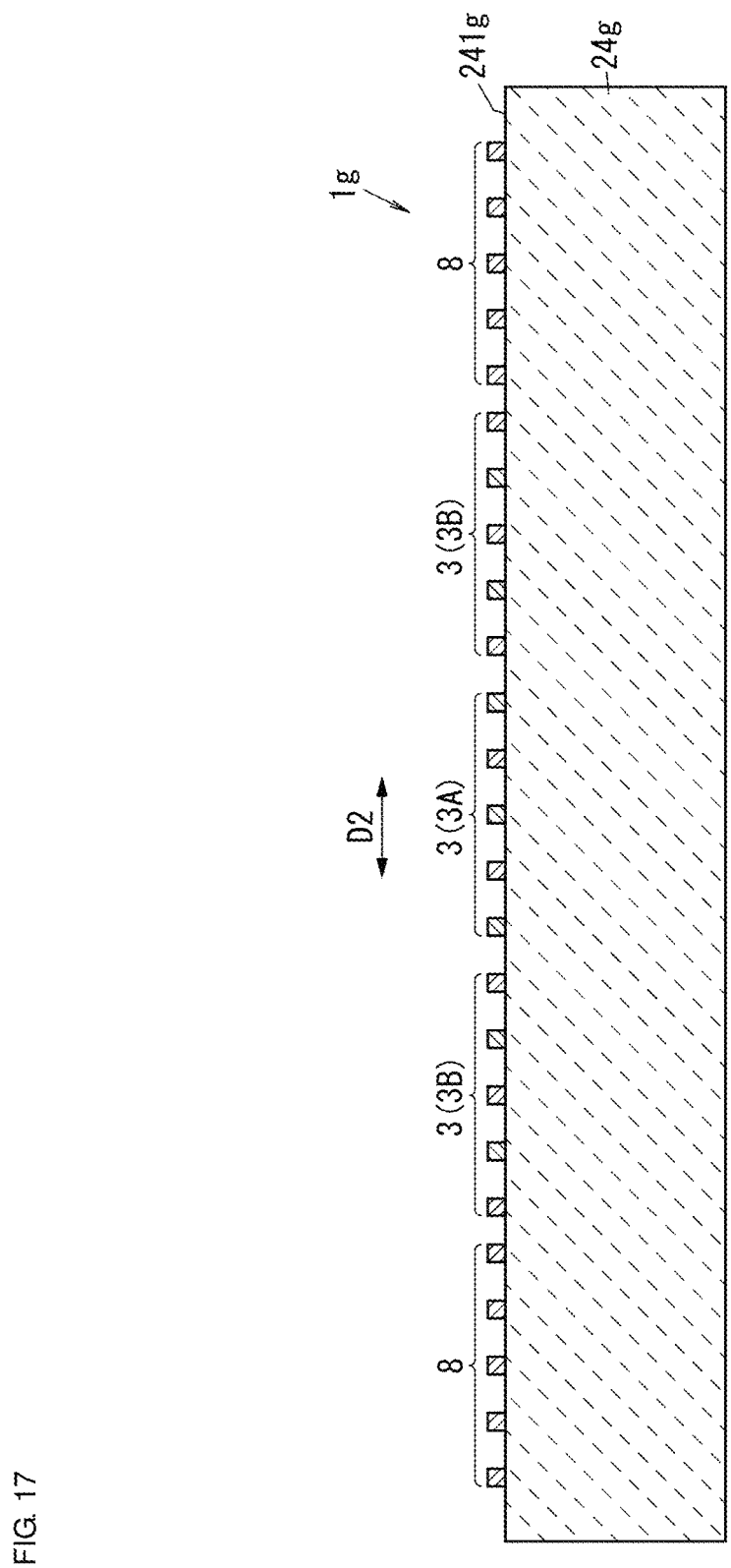
FIG. 17 is a cross-sectional view of an acoustic wave device according to a fifth modification of the second preferred embodiment of the present invention.

As shown in FIG. 17, in an acoustic wave device 1g according to a fifth modification of the second preferred embodiment, a piezoelectric body portion 24g includes a piezoelectric substrate, and the high acoustic velocity support substrate 21 and the low acoustic velocity film 23 in the acoustic wave device 1b according to the second preferred embodiment are not provided. As for the acoustic wave device 1g according to the fifth modification, like reference numerals denote the same or similar components to those of the acoustic wave device 1b (see FIG. 7 to FIG. 11) according to the second preferred embodiment, and the description thereof is omitted.

In the acoustic wave device 1g, the piezoelectric substrate that defines the piezoelectric body portion 24g is preferably a 128-degree Y-X lithium niobate (LiNbO$_3$) substrate, for example. The piezoelectric substrate is preferably made of, for example, a substrate including a 50-degree Y-cut X-propagation lithium tantalate (LiTaO$_3$) piezoelectric monocrystal or piezoelectric ceramics (lithium tantalate monocrystal or ceramics cut along a plane having an axis rotated by about 50 degrees from the Y-axis about the X-axis as the direction of the normal, and through which acoustic waves propagate in the X-axis direction). Although not shown in FIG. 17, the acoustic wave device 1g includes a silicon oxide (SiO$_2$) film that covers the plurality of (three) interdigital transducer electrodes 3, the two reflectors 8, and a region not covered with the plurality of (three) interdigital transducer electrodes 3 and the two reflectors 8 on one main surface 241g of the piezoelectric body portion 24g. In the acoustic wave device 1g, the surface shape of the silicon oxide film has recesses and protrusions corresponding to the shapes of the three interdigital transducer electrodes 3 and two reflectors 8.

With the acoustic wave device 1g according to the fifth modification, as well as the acoustic wave device 1b (see FIG. 7 to FIG. 11) according to the second preferred embodiment, surge breakdown due to ESD between the outer busbar portion 51 of the first interdigital transducer electrode 3A and the outer busbar portion 51 of the second interdigital transducer electrode 3B is significantly reduced or prevented, so ESD tolerance is significantly improved.

(2.10) Other Modifications of Second Embodiment

The number of the plurality of first electrode fingers 6 and the number of the plurality of second electrode fingers 7 in each of the plurality of interdigital transducer electrodes 3 are not limited. Here, in the first interdigital transducer electrode 3A, the first end electrode finger and the second end electrode finger respectively located at one end and the other end in the second direction D2 of the group of electrode fingers are not limited to the first electrode fingers 6. For example, one of the first end electrode finger and the second end electrode finger may be the first electrode finger 6, and the other may be the second electrode finger 7. Accordingly, the inner busbar portion 52 of the second busbar 5 is close to the first electrode finger 6 that is the first end electrode finger, and the inner busbar portion 42 of the first busbar 4 is close to the second electrode finger 7 that is the second end electrode finger. Each of the first end electrode finger and the second end electrode finger may be the second electrode finger 7. Accordingly, the inner busbar portion 42 of the first busbar 4 is close to the second electrode fingers 7 that are respectively the first end electrode finger and the second end electrode finger. The group of electrode fingers only needs to include the plurality of first electrode fingers 6 and the plurality of second electrode fingers 7 spaced apart from each other in the second direction D2 perpendicular or substantially perpendicular to the first direction D1. For example, in an acoustic wave device of one modification, a region in which the first electrode finger 6 and the second electrode finger 7 are provided one by one and spaced apart from each other and a region in which the two first electrode fingers 6 or the two second electrode fingers 7 are provided in the second direction D2 may be mixed. In the acoustic wave device 1d according to the second modification, for the left-side second interdigital transducer electrode 3B in FIG. 13 of the two second interdigital transducer electrodes 3B, the outer busbar portion 51 of the second busbar 5 is located on an inner side in the second direction D2 relative to the inner busbar portion 52 at a side closer to the first interdigital transducer electrode 3A. However, the features are not limited thereto. For example, for the right-side second interdigital transducer electrode 3B in FIG. 13, the outer busbar portion 51 of the second busbar 5 may be located on an inner side in the second direction D2 relative to the inner busbar portion 52 at a side closer to the first interdigital transducer electrode 3A. For the first interdigital transducer electrode 3A, the outer busbar portion 51 of the second busbar 5 may be located on an inner side in the second direction D2 relative to the inner busbar portion 52 at a side closer to at least one of the two second interdigital transducer electrodes 3B. With the acoustic wave device of any one of these as well, the outer busbar portion 51 is located on an inner side in the second direction D2 relative to the inner busbar portion 52, so ESD tolerance is significantly improved. At least one first electrode finger 6 of the plurality of first electrode fingers 6 in each interdigital transducer electrode 3 only needs to include the wide portion 62, and at least one second electrode finger 7 of the plurality of second electrode fingers 7 in each interdigital transducer electrode 3 only needs to include have the wide portion 72.

The above-described first and second preferred embodiments, and the like, are each merely one of various preferred embodiments of the present invention. The above-described preferred embodiments each may be modified into various forms according to design, or the like, as long as the object of the present invention is provided.

For example, in the acoustic wave devices 1, 1a, 1b, 1c, 1d, 1e, 1f, 1g, the interdigital transducer electrode(s) 3 is/are directly provided on one main surface 214 of the piezoelectric body portion 24 or one main surface 241g of the piezoelectric body portion 24g. However, the present invention is not limited thereto. The interdigital transducer electrode(s) 3 may be indirectly provided on one main surface 214 of the piezoelectric body portion 24 or one main surface 241g of the piezoelectric body portion 24g. For example, in the acoustic wave devices 1, 1a, 1b, 1c, 1d, 1e, 1f, 1g, the interdigital transducer electrode(s) 3 may be provided on one main surface 241 of the piezoelectric body portion 24 or one main surface 241g of the piezoelectric body portion 24g via a dielectric film.

In the acoustic wave devices 1, 1a, 1b, 1c, 1d, 1e, the multilayer board 2 or multilayer board 2b may include a film interposed between the low acoustic velocity film 23 and the high acoustic velocity support substrate 21. In the acoustic wave device 1f, the multilayer board 2f may include at least one of a film interposed between the high acoustic velocity film 22 and the support substrate 20 and a film interposed between the low acoustic velocity film 23 and the piezoelectric body portion 24. In the acoustic wave devices 1, 1a, 1b, 1c, 1d, 1e, the multilayer board 2 or multilayer board 2b may include an acoustic impedance layer instead of the low acoustic velocity film 23 between the piezoelectric body portion 24 and the high acoustic velocity support substrate 21. The acoustic impedance layer significantly reduces or prevents leakage of acoustic waves excited by the interdigital transducer electrode 3 into the high acoustic velocity support substrate 21. The acoustic impedance layer has a multilayer structure in which at least one high acoustic impedance layer having a relatively high acoustic impedance and at least one low acoustic impedance layer having a relatively low acoustic impedance are laminated in the thickness direction of the high acoustic velocity support substrate 21. In the above-described multilayer structure, a plurality of the high acoustic impedance layers may be provided, and a plurality of the low acoustic impedance layers may be provided. Accordingly, the above-described multilayer structure is a structure in which the plurality of high acoustic impedance layers and the plurality of low acoustic impedance layers are alternately laminated one by one in the thickness direction of the high acoustic velocity support substrate 21.

The high acoustic impedance layer is preferably made of, for example, platinum, tungsten, aluminum nitride, lithium tantalate, sapphire, lithium niobate, silicon nitride, or zinc oxide.

The low acoustic impedance layer is preferably made of, for example, silicon oxide, aluminum, or titanium.

The structure including the plurality of interdigital transducer electrodes 3 is not limited to the longitudinally coupled resonator filter and may be, for example, transversely coupled resonator-type filter, a ladder filter, or the like.

From the above-described preferred embodiments, and the like, the following features are provided.

An acoustic wave device (1; 1a; 1b; 1c; 1d; 1e; 1f; 1g) according to a preferred embodiment of the present invention includes a first terminal (11), a second terminal (12), a piezoelectric body portion (24; 24g), an interdigital transducer electrode (3), and a reflector (8). The second terminal (12) has a lower potential than the first terminal (11). The interdigital transducer electrode (3) is provided on or above the piezoelectric body portion (24; 24g) and electrically connected to the first terminal (11) and the second terminal (12). The reflector (8) is provided on or above the piezoelectric body portion (24; 24g) and electrically connected to the second terminal (12). The interdigital transducer electrode (3) includes a first busbar (4), a second busbar (5), a plurality of first electrode fingers (6), and a plurality of second electrode fingers (7). The first busbar (4) is electrically connected to the first terminal (11). The second busbar (5) is opposed to the first busbar (4) in a first direction (D1) and electrically connected to the second terminal (12). The plurality of first electrode fingers (6) are connected to the first busbar (4) and have a greater width from the first busbar (4) toward the second busbar (5) in the first direction (D1). The plurality of second electrode fingers (7) are connected to the second busbar (5) and have a greater width from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). At least one electrode finger of the plurality of first electrode fingers (6) includes a wide portion (62) having a greater width in the second direction (D2) than a center portion (60), in the first direction (D1), of the at least one electrode finger. At least one electrode finger of the plurality of second electrode fingers (7) includes a wide portion (72) having a greater width in the second direction (D2) than a center portion (70), in the first direction (D1), of the at least one electrode finger. Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). In the interdigital transducer electrode (3), where, of a group of electrode fingers including the plurality of first electrode fingers (6) and the plurality of second electrode fingers (7), the electrode finger (the second electrode finger 7L or the second electrode finger 7R) located at one end in the second direction (D2) is a first end electrode finger and the electrode finger (the second electrode finger 7R or the second electrode finger 7L) located at the other end is a second end electrode finger, the first end electrode finger is located between the reflector (8) and the second end electrode finger in the second direction (D2). The outer busbar portion (41) of one (first busbar 4) of the first busbar (4) and the second busbar (5), not connected to the first end electrode finger (the second electrode finger 7L or the second electrode finger 7R), is located on an inner side in the second direction (D2) relative to the center portion (70), in the first direction (D1), of the first end electrode finger (the second electrode finger 7L or the second electrode finger 7R).

With the above-described acoustic wave device (1; 1a; 1b; 1c; 1d; 1e; 1f; 1g), ESD tolerance is significantly improved while interference with a piston mode is significantly reduced or prevented.

An acoustic wave device (1; 1a; 1b; 1c; 1d; 1e; 1f; 1g) according to a preferred embodiment of the present invention includes the two reflectors (8). The two reflectors (8) are provided one by one on both sides of the interdigital transducer electrode (3) in the second direction (D2). The outer busbar portion (41) of one (first busbar 4) of the first busbar (4) and the second busbar (5), not connected to the first end electrode finger (the second electrode finger 7L or the second electrode finger 7R) or the second end electrode finger (the second electrode finger 7R or the second electrode finger 7L), is located on an inner side in the second direction (D2) relative to the wide portion (72) of the first end electrode finger (the second electrode finger 7L or the second electrode finger 7R) and the wide portion (72) of the second end electrode finger (the second electrode finger 7R or the second electrode finger 7L).

With the above-described acoustic wave device (1; 1a; 1b; 1c; 1d; 1e; 1f; 1g), surge breakdown is less likely to occur, and ESD tolerance significantly improves as compared to when the outer busbar portion (41) of one (first busbar 4) of the first busbar (4) and the second busbar (5), not connected to the first end electrode finger (the second electrode finger 7L or the second electrode finger 7R) or the second end electrode finger (the second electrode finger 7R or the second electrode finger 7L), overlaps in the first direction (D1) the wide portion (72) of the first end electrode finger (the second electrode finger 7L or the second electrode finger 7R) and the wide portion (72) of the second end electrode finger (the second electrode finger 7R or the second electrode finger 7L).

An acoustic wave device (1; 1a; 1b; 1c; 1d; 1e; 1f; 1g) according to a preferred embodiment of the present invention includes the two reflectors (8). The two reflectors (8) are provided one by one on both sides of the interdigital transducer electrode (3) in the second direction (D2). The outer busbar portion (41) of one (the first busbar 4) of the first busbar (4) and the second busbar (5), not connected to the first end electrode finger (the second electrode finger 7L or the second electrode finger 7R) or the second end electrode finger (the second electrode finger 7R or the second electrode finger 7L), is located on an inner side in the second direction (D2) relative to the first end electrode finger (the second electrode finger 7L or the second electrode finger 7R) and the second end electrode finger (the second electrode finger 7R or the second electrode finger 7L) and does not overlap in the first direction (D1) each of the first end electrode finger (the second electrode finger 7L or the second electrode finger 7R) and the second end electrode finger (the second electrode finger 7R or the second electrode finger 7L).

With the above-described acoustic wave device (1; 1a; 1b; 1c; 1d; 1e; 1f; 1g), ESD tolerance is significantly improved.

In an acoustic wave device (1; 1a; 1b; 1c; 1d; 1e; 1f; 1g) according to a preferred embodiment of the present invention, one side (the side 42L or the side 42R), along the first direction (D1), of the inner busbar portion (42) of one (the first busbar 4) of the first busbar (4) and the second busbar (5), not connected to the first end electrode finger (the second electrode finger 7L or the second electrode finger 7R) or the second end electrode finger (the second electrode finger 7R or the second electrode finger 7L), and a side (the side 72LL or the side 72RR), away from the second end electrode finger (the second electrode finger 7R or the second electrode finger 7L), of the wide portion (72) of the first end electrode finger (the second electrode finger 7L or the second electrode finger 7R) are aligned in a straight line or substantially in a straight line.

With the above-described acoustic wave device (1; 1a; 1b; 1c; 1d; 1e; 1f; 1g), ESD tolerance is significantly improved by changing only the shape of the outer busbar portion (41) of one (the first busbar 4) of the first busbar (4) and the second busbar (5), not connected to the first end electrode finger (the second electrode finger 7L or the second electrode finger 7R) or the second end electrode finger (the second electrode finger 7R or the second electrode finger 7L), without changing the shape of the inner busbar portion (42) of the busbar (the first busbar 4) not connected to the first end electrode finger (the second electrode finger 7L or the second electrode finger 7R) or the second end electrode finger (the second electrode finger 7R or the second electrode finger 7L), so ESD tolerance is further improved while interference with a piston mode is significantly reduced or prevented.

An acoustic wave device (1b; 1c; 1d; 1e; 1f; 1g) according to a preferred embodiment of the present invention includes a first terminal (11), a second terminal (12), a piezoelectric body portion (24; 24g), a plurality of interdigital transducer electrodes (3), and two reflectors (8). The second terminal (12) has a lower potential than the first terminal (11). The plurality of interdigital transducer electrodes (3) are provided on or above the piezoelectric body portion (24; 24g) and electrically connected to the first terminal (11) and the second terminal (12). The two reflectors (8) are provided on or above the piezoelectric body portion (24; 24g) and reflect acoustic waves excited by the plurality of interdigital transducer electrodes (3). Each of the plurality of interdigital transducer electrodes (3) includes a first busbar (4), a second busbar (5), a plurality of first electrode fingers (6), and a plurality of second electrode fingers (7). The second busbar (5) is opposed to the first busbar (4) in the first direction (D1). The plurality of first electrode fingers (6) are connected to the first busbar (4) and have a greater width from the first busbar (4) toward the second busbar (5) in the first direction (D1). The plurality of second electrode fingers (7) are connected to the second busbar (5) and have a greater width from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). At least one electrode finger of the plurality of first electrode fingers (6) includes a wide portion (62) having a greater width in the second direction (D2) than a center portion (60), in the first direction (D1), of the at least one electrode finger. At least one electrode finger of the plurality of second electrode fingers (7) includes a wide portion (72) having a greater width in the second direction (D2) than a center portion (70), in the first direction (D1), of the at least one electrode finger. Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). The plurality of interdigital transducer electrodes (3) are provided in the second direction (D2). The two reflectors (8) each are located across the interdigital transducer electrode (3) at any one of both sides of the plurality of interdigital transducer electrodes (3) provided in the second direction (D2) from the interdigital transducer electrode (3) adjacent to the interdigital transducer electrode (3) at the any one of both sides. In the interdigital transducer electrode (3) adjacent to one of the two reflectors (8) of the plurality of interdigital transducer electrodes (3), where, of a group of electrode fingers including the plurality of first electrode fingers (6) and the plurality of second electrode fingers (7), the electrode finger (the first end electrode finger 6) located at one end in the second direction (D2) is a first end electrode finger and the electrode finger (the first electrode finger 6) located at the other end is a second end electrode finger, the first end electrode finger is located between the one of the two reflectors (8) and the second end electrode finger in the second direction (D2). In the interdigital transducer electrode (3) adjacent to the one of the reflectors (8), the outer busbar portion (51) of one (the second busbar 5) of the first busbar (4) and the second busbar (5), not connected to the first end electrode finger (the first electrode finger 6), is located on an inner side in the second direction (D2) relative to a center portion (60), in the first direction (D1), of the first end electrode finger (the first electrode finger 6).

With the above-described acoustic wave device (1*b*; 1*c*; 1*d*; 1*e*; 1*f*; 1*g*), ESD tolerance is significantly improved while interference with a piston mode is significantly reduced or prevented.

In an acoustic wave device (1*b*; 1*c*; 1*d*; 1*e*; 1*f*; 1*g*) according to a preferred embodiment of the present invention, in the interdigital transducer electrode (3) adjacent to the one of the reflectors (8), the outer busbar portion (the outer busbar portion 51) of one (second busbar 5) of the first busbar (4) and the second busbar (5), not connected to the first end electrode finger (first electrode finger 6) or the second end electrode finger (the first electrode finger 6), is located on an inner side in the second direction (D2) relative to the wide portion (62) of the first end electrode finger (the first electrode finger 6) and the wide portion (62) of the second end electrode finger (the first electrode finger 6).

With the above-described acoustic wave device (1*b*; 1*c*; 1*e*; 1*f*; 1*g*), surge breakdown is less likely to occur, and ESD tolerance significantly improves as compared to when, in the interdigital transducer electrode (3) adjacent to the one of the reflectors (8), the outer busbar portion (51) of one (the second busbar 5) of the first busbar (4) and the second busbar (5), not connected to the first end electrode finger (the first electrode finger 6) or the second end electrode finger (the first electrode finger 6), overlaps in the first direction (D1) the wide portion (62) of the first end electrode finger (the first electrode finger 6) and the wide portion (62) of the second end electrode finger (the first electrode finger 6).

In an acoustic wave device (1*b*; 1*c*; 1*e*; 1*f*; 1*g*) according to a preferred embodiment of the present invention, in the interdigital transducer electrode (3) adjacent to the one of the reflectors (8), the outer busbar portion (51) of one (second busbar 5) of the first busbar (4) and the second busbar (5), not connected to the first end electrode finger (the first electrode finger 6) or the second end electrode finger (the first electrode finger 6), is located on an inner side in the second direction (D2) and does not overlap in the first direction (D1) the first end electrode finger (the first electrode finger 6) or the second end electrode finger (the first electrode finger 6).

With the above-described acoustic wave device (1*b*; 1*c*; 1*e*; 1*f*; 1*g*), ESD tolerance is significantly improved.

In an acoustic wave device according to a preferred embodiment of the present invention, in the interdigital transducer electrode (3) adjacent to the one of the reflectors (8), a side, closer to the one of the reflectors (8), of the inner busbar portion (the inner busbar portion 52) of one (the second busbar 5) of the first busbar (4) and the second busbar (5), not connected to the first end electrode finger (the first electrode finger 6) or the second end electrode finger (the first electrode finger 6), and a side, closer to the one of the reflectors (8), of the wide portion (62) of the first end electrode finger (the first electrode finger 6) are aligned in a straight line or substantially in a straight line.

With the above-described acoustic wave device (1*b*; 1*c*; 1*e*; 1*f*; 1*g*), ESD tolerance is significantly improved by changing only the shape of the outer busbar portion (51) of one (the second busbar 5) of the first busbar (4) and the second busbar (5), not connected to the first end electrode finger (the first electrode finger 6) or the second end electrode finger (the first electrode finger 6), without changing the shape of the inner busbar portion (52) of one (the second busbar 5) of the first busbar (4) and the second busbar (5), not connected to the first end electrode finger (the first electrode finger 6) or the second end electrode finger (the first electrode finger 6), so ESD tolerance is further improved while interference with a piston mode is significantly reduced or prevented.

An acoustic wave device (1; 1*a*; 1*b*; 1*c*; 1*d*; 1*e*; 1*f*; 1*g*) according to a preferred embodiment of the present invention includes a first terminal (11), a second terminal (12), a piezoelectric body portion (24; 24*g*), an interdigital transducer electrode (3), and a reflector (8). The second terminal (12) has a lower potential than the first terminal (11). The interdigital transducer electrode (3) is provided on or above the piezoelectric body portion (24; 24*g*) and electrically connected to the first terminal (11) and the second terminal (12). The reflector (8) is provided on or above the piezoelectric body portion (24; 24*g*) and electrically connected to the second terminal (12). The interdigital transducer electrode (3) includes a first busbar (4), a second busbar (5), a plurality of first electrode fingers (6), and a plurality of second electrode fingers (7). The first busbar (4) is electrically connected to the first terminal (11). The second busbar (5) is opposed to the first busbar (4) in a first direction (D1) and electrically connected to the second terminal (12). The plurality of first electrode fingers (6) are connected to the first busbar (4) and have a greater width from the first busbar (4) toward the second busbar (5) in the first direction (D1). The plurality of second electrode fingers (7) are connected to the second busbar (5) and have a greater width from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). At least one electrode finger of the plurality of first electrode fingers (6) includes a wide portion (62) having a greater width in the second direction (D2) than a center portion (60), in the first direction (D1), of the at least one electrode finger. At least one electrode finger of the plurality of second electrode fingers (7) includes a wide portion (72) having a greater width in the second direction (D2) than a center portion (70), in the first direction (D1), of the at least one electrode finger. Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). In the interdigital transducer electrode (3), where, of a group of electrode fingers including the plurality of first electrode fingers (6) and the plurality of second electrode fingers (7), the electrode finger (the second electrode finger 7L or the second electrode finger 7R) located at one end in the second direction (D2) is a first end electrode finger and the electrode finger (the second electrode finger 7R or the second electrode finger 7L) located at the other end is a second end electrode finger, the first end electrode finger is located between the reflector (8) and the second end electrode finger in the second direction (D2). The outer busbar portion (41) of one (first busbar 4) of the first busbar (4) and the second busbar (5), not connected to the first end electrode finger (the second electrode finger 7L or the second electrode finger 7R), is located on an inner side in the second direction (D2) relative to the inner busbar portion (42) of the busbar (the first busbar 4) not connected to the first end electrode finger (the second electrode finger 7L or the second electrode finger 7R).

With the above-described acoustic wave device (1; 1*a*; 1*b*; 1*c*; 1*d*; 1*e*; 1*f*; 1*g*), ESD tolerance is significantly improved while interference with a piston mode is significantly reduced or prevented.

An acoustic wave device (1*b*; 1*c*; 1*d*; 1*e*; 1*f*; 1*g*) according to a preferred embodiment of the present invention includes a first terminal (11), a second terminal (12), a piezoelectric body portion (24; 24*g*), a plurality of interdigital transducer electrodes (3), and two reflectors (8). The second terminal (12) has a lower potential than the first terminal (11). The plurality of interdigital transducer electrodes (3) are provided on or above the piezoelectric body portion (24; 24*g*) and electrically connected to the first terminal (11) and the second terminal (12). The two reflectors (8) are provided on or above the piezoelectric body portion (24; 24*g*) and reflect acoustic waves excited by the plurality of interdigital transducer electrodes (3). Each of the plurality of interdigital transducer electrodes (3) includes a first busbar (4), a second busbar (5), a plurality of first electrode fingers (6), and a plurality of second electrode fingers (7). The second busbar (5) is opposed to the first busbar (4) in the first direction (D1). The plurality of first electrode fingers (6) are connected to the first busbar (4) and have a greater width from the first busbar (4) toward the second busbar (5) in the first direction (D1). The plurality of second electrode fingers (7) are connected to the second busbar (5) and have a greater width from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). At least one electrode finger of the plurality of first electrode fingers (6) includes a wide portion (62) having a greater width in the second direction (D2) than a center portion (60), in the first direction (D1), of the at least one electrode finger. At least one electrode finger of the plurality of second electrode fingers (7) includes a wide portion (72) having a greater width in the second direction (D2) than a center portion (70), in the first direction (D1), of the at least one electrode finger. Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). The plurality of interdigital transducer electrodes (3) is provided in the second direction (D2). The two reflectors (8) each are located across the interdigital transducer electrode (3) at any one of both sides of the plurality of interdigital transducer electrodes (3) provided in the second direction (D2) from the interdigital transducer electrode (3) adjacent to the interdigital transducer electrode (3) at the any one of both sides. In the interdigital transducer electrode (3) adjacent to one of the two reflectors (8) of the plurality of interdigital transducer electrodes (3), where, of a group of electrode fingers including the plurality of first electrode fingers (6) and the plurality of second electrode fingers (7), the electrode finger (the first end electrode finger 6) located at one end in the second direction (D2) is a first end electrode finger and the electrode finger (the first electrode finger 6) located at another end is a second end electrode finger, the first end electrode finger (the first electrode finger 6) is located between the one of the reflectors (8) and the second end electrode finger (the first electrode finger 6) in the second direction (D2). In the interdigital transducer electrode (3) adjacent to the one of the reflectors (8), the outer busbar portion (51) of one (the second busbar 5) of the first busbar (4) and the second busbar (5), not connected to the first end electrode finger (the first electrode finger 6), is located on an inner side in the second direction (D2) relative to the inner busbar portion (52) of the busbar (the second busbar) not connected to the first end electrode finger (the first electrode finger 6).

With the above-described acoustic wave device (1*b*; 1*c*; 1*d*; 1*e*; 1*f*; 1*g*) according to the tenth aspect, ESD tolerance is significantly improved while interference with a piston mode is significantly reduced or prevented.

An acoustic wave device (1*b*; 1*c*; 1*d*; 1*e*; 1*f*; 1*g*) according to a preferred embodiment of the present invention includes a first terminal (11), a second terminal (12), a piezoelectric body portion (24; 24*g*), and a plurality of interdigital transducer electrodes (3). The second terminal (12) has a lower potential than the first terminal (11). The plurality of interdigital transducer electrodes (3) are provided on or above the piezoelectric body portion (24; 24*g*) and electrically connected to the first terminal (11) and the second terminal (12). Each of the plurality of interdigital transducer electrodes (3) includes a first busbar (4), a second busbar (5), a plurality of first electrode fingers (6), and a plurality of second electrode fingers (7). The second busbar (5) is opposed to the first busbar (4) in the first direction (D1). The plurality of first electrode fingers (6) are connected to the first busbar (4) and have a greater width from the first busbar (4) toward the second busbar (5) in the first direction (D1). The plurality of second electrode fingers (7) are connected to the second busbar (5) and have a greater width from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). At least one electrode finger of the plurality of first electrode fingers (6) includes a wide portion (62) having a greater width in the second direction (D2) than a center portion (60), in the first direction (D1), of the at least one electrode finger. At least one electrode finger of the plurality of second electrode fingers (7) includes a wide portion (72) having a greater width in the second direction (D2) than a center portion (70), in the first direction (D1), of the at least one electrode finger. Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). Where, of the plurality of interdigital transducer electrodes (3), one of the adjacent two interdigital transducer electrodes (3) in the second direction (D2) is a first interdigital transducer electrode (3A) and another one is a second interdigital transducer electrode (3B), a distance between the outer busbar portion (51) not connected to, of a group of electrode fingers including the plurality of first electrode fingers (6) and the plurality of second electrode fingers (7), the electrode finger closest to the second interdigital transducer electrode (3B) in the first interdigital transducer electrode (3A) and the outer busbar portion (51) not connected to, of a group of electrode fingers including the plurality of first electrode fingers (6) and the plurality of second electrode fingers (7), the electrode finger closest to the first interdigital transducer electrode (3A) in the second interdigital transducer electrode (3B) is greater than a distance between a center portion (60) of the electrode finger (the first electrode finger 6) closest to the second interdigital transducer electrode (3B) in the first interdigital transducer electrode (3A) and a center portion (60) of the electrode finger (the first electrode finger 6) closest to the first interdigital transducer electrode (3A) in the second interdigital transducer electrode (3B).

With the above-described acoustic wave device (1b; 1c; 1d; 1e; 1f; 1g) according to the eleventh aspect, ESD tolerance is significantly improved while interference with a piston mode is significantly reduced or prevented.

An acoustic wave device (1b; 1c; 1f; 1g) according to a preferred embodiment of the present invention includes a first terminal (12), a second terminal (12), a piezoelectric body portion (24; 24g), and a plurality of interdigital transducer electrodes (3). The second terminal (12) has a lower potential than the first terminal (11). The plurality of interdigital transducer electrodes (3) are provided on or above the piezoelectric body portion (24; 24g) and electrically connected to the first terminal (11) and the second terminal (12). Each of the plurality of interdigital transducer electrodes (3) includes a first busbar (4), a second busbar (5), a plurality of first electrode fingers (6), and a plurality of second electrode fingers (7). The second busbar (5) is opposed to the first busbar (4) in the first direction (D1). The plurality of first electrode fingers (6) are connected to the first busbar (4) and have a greater width from the first busbar (4) toward the second busbar (5) in the first direction (D1). The plurality of second electrode fingers (7) are connected to the second busbar (5) and have a greater width from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). At least one electrode finger of the plurality of first electrode fingers (6) includes a wide portion (62) having a greater width in the second direction (D2) than a center portion (60), in the first direction (D1), of the at least one electrode finger. At least one electrode finger of the plurality of second electrode fingers (7) includes a wide portion (72) having a greater width in the second direction (D2) than a center portion (70), in the first direction (D1), of the at least one electrode finger. Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). Where, of the plurality of interdigital transducer electrodes (3), one of the adjacent two interdigital transducer electrodes (3) in the second direction (D2) is a first interdigital transducer electrode (3A) and another is a second interdigital transducer electrode (3B), and where, of a group of electrode fingers including the plurality of first electrode fingers (6) and the plurality of second electrode fingers (7) of the first interdigital transducer electrode (3A), the electrode finger (the first end electrode finger 6) located at an end closer to the second interdigital transducer electrode (3B) in the second direction (D2) is a first end electrode finger of the first interdigital transducer electrode (3A), the electrode finger (the first electrode finger 6) located at an end away from the second interdigital transducer electrode (3B) is a second end electrode finger of the first interdigital transducer electrode (3A), and, of a group of electrode fingers including the plurality of first electrode fingers (6) and the plurality of second electrode fingers (7) of the second interdigital transducer electrode (3B), the electrode finger (the first electrode finger 6) located at an end closer to the first interdigital transducer electrode (3A) in the second direction (D2) is a first end electrode finger of the second interdigital transducer electrode (3B) and the electrode finger (the first electrode finger 6) located at an end away from the first interdigital transducer electrode (3A) is a second end electrode finger of the second interdigital transducer electrode (3B), the first end electrode finger of the first interdigital transducer electrode (3A) is connected to the first terminal (11), and the first end electrode finger of the second interdigital transducer electrode (3B) is connected to the second terminal (12). In each of the first interdigital transducer electrode (3A) and the second interdigital transducer electrode (3B), the outer busbar portion (51) electrically connected to one of the first terminal (11) and the second terminal (12), different from the terminal to which the first end electrode finger is connected, is located on an inner side in the second direction (D2) relative to the inner busbar portion (52) electrically connected to the one of the first terminal (11) and the second terminal (12), different from the terminal to which the first end electrode finger is connected.

With the above-described acoustic wave device (1b; 1c; 1f; 1g), ESD tolerance is significantly improved while interference with a piston mode is significantly reduced or prevented.

An acoustic wave device (1b; 1c; 1d; 1e; 1f; 1g) according to a preferred embodiment of the present invention includes a first terminal (11), a second terminal (12), a piezoelectric body portion (24; 24g), and a plurality of interdigital transducer electrodes (3). The second terminal (12) has a lower potential than the first terminal (11). The plurality of interdigital transducer electrodes (3) are provided on or above the piezoelectric body portion (24; 24g) and electrically connected to the first terminal (11) and the second terminal (12). Each of the plurality of interdigital transducer electrodes (3) includes a first busbar (4), a second busbar (5), a plurality of first electrode fingers (6), and a plurality of second electrode fingers (7). The second busbar (5) is opposed to the first busbar (4) in the first direction (D1). The plurality of first electrode fingers (6) are connected to the first busbar (4) and have a greater width from the first busbar (4) toward the second busbar (5) in the first direction (D1). The plurality of second electrode fingers (7) are connected to the second busbar (5) and have a greater width from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). At least one electrode finger of the plurality of first electrode fingers (6) includes a wide portion (62) having a greater width in the second direction (D2) than a center portion (60), in the first direction (D1), of the at least one electrode finger. At least one electrode finger of the plurality of second electrode fingers (7) includes a wide portion (72) having a greater width in the second direction (D2) than a center portion (70), in the first direction (D1), of the at least one electrode finger. Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). In at least one of the plurality of interdigital transducer electrodes (3), where, of a group of electrode fingers including the plurality of first electrode fingers (6) and the plurality of second electrode fingers (7), the electrode finger (the first electrode finger 6) located at one end in the second direction (D2) is a first end electrode finger and the electrode finger (the first electrode finger 6) located at another end is a second end electrode finger, the first end electrode finger is located closer to the interdigital transducer electrode (3) adjacent to the at least one interdigital transducer electrode (3) in the second direction (D2). In the at least one interdigital transducer electrode (3), the outer busbar portion (51) of one (the second busbar 5) of the first busbar (4) and the second busbar (5), not connected to the first end electrode finger, is located on an inner side in the second direction (D2) relative to the inner busbar portion (52) of the one (the second busbar 5) of the first busbar (4) and the second busbar (5), not connected to the first end electrode finger, at least at a side closer to the adjacent interdigital transducer electrode (3).

With the above described acoustic wave device (1b; 1c; 1d; 1e; 1f; 1g), ESD tolerance is significantly improved while interference with a piston mode is significantly reduced or prevented.

In an acoustic wave device (1b; 1c; 1d; 1e; 1f; 1g) according to a preferred embodiment of the present invention, the plurality of interdigital transducer electrodes (3) are provided in the second direction (D2), and the acoustic wave device further includes two reflectors (8). The two reflectors (8) each are provided across the interdigital transducer electrode (3) at any one of both sides of the plurality of interdigital transducer electrodes (3) provided in the second direction (D2) one by one on or above the piezoelectric body portion (24) from the interdigital transducer electrode (3) adjacent to the interdigital transducer electrode (3) at the any one of both sides. The two reflectors (8) are reflect acoustic waves excited by the plurality of interdigital transducer electrodes (3).

The above-described acoustic wave device (1b; 1c; 1d; 1e; 1f; 1g) is able to provide a longitudinally coupled resonator filter.

In an acoustic wave device (1; 1a; 1b; 1c; 1d; 1e; 1f) according to a preferred embodiment of the present invention, a distal end portion (61) of at least one of the plurality of first electrode fingers (6) includes a wide portion (62), and a distal end portion (71) of at least one of the plurality of second electrode fingers (7) includes a wide portion (72).

In an acoustic wave device (1; 1a; 1b; 1c; 1d; 1e; 1f; 1g) according to a preferred embodiment of the present invention, the acoustic wave device (1; 1a; 1b; 1c; 1d; 1e; 1f; 1g) includes a plurality of regions (A1 to A11) different from each other in the first direction (D1) in plan view taken in a thickness direction of the acoustic wave device (1; 1a; 1b; 1c; 1d; 1e; 1f; 1g). The plurality of regions (A1 to A11) include a center region (the region A6), two outer busbar regions (the regions A1, A11), two inner busbar regions (the regions A3, A9), two coupling regions (the regions A2, A10), two gap regions (the regions A4, A8), and two wide regions (A7, A5). The center region (the region A6) is located in a center in the first direction (D1) and includes center portions (60) of the plurality of first electrode fingers (6) and center portions (70) of the plurality of second electrode fingers (7). The two outer busbar regions (the regions A1, A11) respectively include the outer busbar portion (41) of the first busbar (4) and the outer busbar portion (51) of the second busbar (5). The two inner busbar regions (the regions A3, A9) respectively include the inner busbar portion (42) of the first busbar (4) and the inner busbar portion (52) of the second busbar (5). The two coupling regions (the regions A2, A10) respectively include the coupling portion (43) and opening portion (40) of the first busbar (4) and the coupling portion (53) and opening portion (50) of the second busbar (5). The two gap regions (the regions A4, A8) respectively include a gap (31) between the plurality of first electrode fingers (6) and the second busbar (5) and a gap (32) between the plurality of second electrode fingers (7) and the first busbar (4). The two wide regions (A7, A5) respectively include the wide portion (62) of at least one electrode finger (the first electrode finger 6) of the plurality of first electrode fingers (6) and the wide portion (72) of at least one electrode finger (the second electrode finger 7) of the plurality of second electrode fingers (7). An acoustic velocity of acoustic waves in the two outer busbar regions (the regions A1, A11) is lower than the acoustic velocity in the center region (the region A6). An acoustic velocity of acoustic waves in the two inner busbar regions (the regions A3, A9) is lower than the acoustic velocity in the center region (the region A6). An acoustic velocity of acoustic waves in the two coupling regions (the regions A2, A10) is higher than the acoustic velocity in the two outer busbar regions (the regions A1, A11) or the acoustic velocity in the center region (the region A6). An acoustic velocity of acoustic waves in the two gap regions (the regions A4, A8) is higher than the acoustic velocity in the two inner busbar regions (the regions A3, A9) or the acoustic velocity in the center region (the region A6). An acoustic velocity of acoustic waves in the two wide regions (A7, A5) is lower than the acoustic velocity in the center region (the region A6).

What is claimed is:

1. An acoustic wave device comprising:
    a first terminal;
    a second terminal having a potential that is different from a potential of the first terminal;
    a piezoelectric body portion;
    an interdigital transducer electrode provided on or above the piezoelectric body portion and electrically connected to the first terminal and the second terminal; and
    a reflector provided on or above the piezoelectric body portion and electrically connected to the second terminal; wherein
    the interdigital transducer electrode includes:
        a first busbar electrically connected to the first terminal;
        a second busbar opposed to the first busbar in a first direction and electrically connected to the second terminal;
        a plurality of first electrode fingers connected to the first busbar and extending from the first busbar toward the second busbar in the first direction; and
        a plurality of second electrode fingers connected to the second busbar and extending from the second busbar toward the first busbar in the first direction;
    the plurality of first electrode fingers and the plurality of second electrode fingers are spaced apart from each other in a second direction perpendicular or substantially perpendicular to the first direction;
    the reflector includes two reflectors provided one by one on both sides of the interdigital transducer electrode in the second direction;
    at least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger;
    each of the first busbar and the second busbar includes:
        an opening portion;
        an inner busbar portion located closer to the plurality of first electrode fingers and the plurality of second electrode fingers than the opening portion in the first direction;
        an outer busbar portion located across the opening portion from the inner busbar portion in the first direction; and
        a coupling portion coupling the inner busbar portion and the outer busbar portion in the first direction;
    in the interdigital transducer electrode, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located between the reflector and the second end electrode finger in the second direction;
    the outer busbar portion of one of the first busbar and the second busbar, not connected to the first end electrode finger, is located on an inner side in the second direction relative to a center portion, in the first direction, of the first end electrode finger;
    the outer busbar portion of one of the first busbar and the second busbar, not connected to the first end electrode finger or the second end electrode finger, is located on an inner side in the second direction relative to the first end electrode finger and the second end electrode finger and does not overlap the first end electrode finger or the second end electrode finger in the first direction; and
    one side, along the first direction, of the inner busbar portion of one of the first busbar and the second busbar, not connected to the first end electrode finger or the second end electrode finger, and a side, away from the second end electrode finger, of the wide portion of the first end electrode finger are aligned in a straight line or substantially in a straight line.

2. The acoustic wave device according to claim 1, wherein the outer busbar portion of one of the first busbar and the second busbar, not connected to the first end electrode finger or the second end electrode finger, is located on an inner side in the second direction relative to the wide portion of the first end electrode finger and the wide portion of the second end electrode finger.

3. The acoustic wave device according to claim 1, wherein a distal end portion of at least one of the plurality of first electrode fingers includes the wide portion, and a distal end portion of at least one of the plurality of second electrode fingers includes the wide portion.

4. The acoustic wave device according to claim 1, wherein the acoustic wave device includes a plurality of regions different from each other in the first direction in plan view taken in a thickness direction of the acoustic wave device,
    the plurality of regions include:
        a center region located in a center in the first direction and including center portions of the plurality of first electrode fingers and center portions of the plurality of second electrode fingers;
        two outer busbar regions respectively including the outer busbar portion of the first busbar and the outer busbar portion of the second busbar;
        two inner busbar regions respectively including the inner busbar portion of the first busbar and the inner busbar portion of the second busbar;
        two coupling regions respectively including the coupling portion and opening portion of the first busbar and the coupling portion and opening portion of the second busbar;
        two gap regions respectively including a gap between the second busbar and the plurality of first electrode fingers and a gap between the first busbar and the plurality of second electrode fingers; and
        two wide regions respectively including the wide portion of at least one of the plurality of first electrode fingers and the wide portion of at least one of the plurality of second electrode fingers;
    an acoustic velocity of acoustic waves in the two outer busbar regions is lower than the acoustic velocity in the center region;

an acoustic velocity of acoustic waves in the two inner busbar regions is lower than the acoustic velocity in the center region;

an acoustic velocity of acoustic waves in the two coupling regions is higher than the acoustic velocity in the two outer busbar regions or the acoustic velocity in the center region;

an acoustic velocity of acoustic waves in the two gap regions is higher than the acoustic velocity in the two inner busbar regions or the acoustic velocity in the center region; and an acoustic velocity of acoustic waves in the two wide regions is lower than the acoustic velocity in the center region.

5. The acoustic wave device according to claim 1, further comprising:
a first wiring layer that electrically connects the interdigital transducer electrode to the first terminal; and
a second wiring layer that electrically connects the interdigital transducer electrode to the second terminal.

6. The acoustic wave device according to claim 1, wherein:
the piezoelectric body portion includes a high acoustic velocity support substrate,
a low acoustic velocity film is directly laminated on the high acoustic velocity support substrate, and
an acoustic velocity of bulk waves that propagate through the low acoustic velocity film is lower than an acoustic velocity of the acoustic waves that propagate through the piezoelectric body portion.

7. An acoustic wave device comprising:
a first terminal;
a second terminal having a potential that is different from a potential of the first terminal;
a piezoelectric body portion;
an interdigital transducer electrode provided on or above the piezoelectric body portion and electrically connected to the first terminal and the second terminal; and
a reflector provided on or above the piezoelectric body portion and electrically connected to the second terminal; wherein
the interdigital transducer electrode includes:
a first bulbar electrically connected to the first terminal;
a second busbar opposed to the first busbar in a first direction and electrically connected to the second terminal;
a plurality of first electrode fingers connected to the first busbar and extending from the first busbar toward the second busbar in the first direction; and
a plurality of second electrode fingers connected to the second busbar and extending from the second busbar toward the first busbar in the first direction;
the plurality of first electrode fingers and the plurality of second electrode fingers are spaced apart from each other in a second direction perpendicular or substantially perpendicular to the first direction;
at least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger;
each of the first busbar and the second busbar includes:
an opening portion;
an inner busbar portion located closer to the plurality of first electrode fingers and the plurality of second electrode fingers than the opening portion in the first direction;
an outer busbar portion located across the opening portion from the inner busbar portion in the first direction; and
a coupling portion coupling the inner busbar portion and the outer busbar portion in the first direction;
in the interdigital transducer electrode, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located between the reflector and the second end electrode finger in the second direction; and
the outer busbar portion of one of the first busbar and the second busbar, not connected to the first end electrode finger, is located on an inner side in the second direction relative to the inner busbar portion of the busbar not connected to the first end electrode finger.

8. An acoustic wave device comprising:
a first terminal;
a second terminal having a potential that is different from a potential of the first terminal;
a piezoelectric body portion;
a plurality of interdigital transducer electrodes provided on or above the piezoelectric body portion and electrically connected to the first terminal and the second terminal; and
two reflectors provided on or above the piezoelectric body portion and reflect acoustic waves excited by the plurality of interdigital transducer electrodes; wherein
each of the plurality of interdigital transducer electrodes includes:
a first busbar;
a second busbar opposed to the first busbar in a first direction;
a plurality of first electrode fingers connected to the first busbar and extending from the first busbar toward the second busbar in the first direction; and
a plurality of second electrode fingers connected to the second busbar and extending from the second busbar toward the first busbar in the first direction;
the plurality of first electrode fingers and the plurality of second electrode fingers are spaced apart from each other in a second direction perpendicular or substantially perpendicular to the first direction;
at least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger;
each of the first busbar and the second busbar includes:
an opening portion;
an inner busbar portion located closer to the plurality of first electrode fingers and the plurality of second electrode fingers than the opening portion in the first direction;

an outer busbar portion located across the opening portion from the inner busbar portion in the first direction; and
a coupling portion coupling the inner busbar portion and the outer busbar portion in the first direction;
the plurality of interdigital transducer electrodes are arranged in the second direction;
the two reflectors each are located across the interdigital transducer electrode at any one of both sides of the plurality of interdigital transducer electrodes arranged in the second direction from the interdigital transducer electrode adjacent to the interdigital transducer electrode at the any one of both sides;
in the interdigital transducer electrode adjacent to one of the two reflectors, of the plurality of interdigital transducer electrodes, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located between the one of the two reflectors and the second end electrode finger in the second direction; and
in the interdigital transducer electrode adjacent to the one of the two reflectors, the outer busbar portion of one of the first busbar and the second busbar, not connected to the first end electrode finger, is located on an inner side in the second direction relative to the inner busbar portion of the busbar not connected to the first end electrode finger.

9. An acoustic wave device comprising:
a first terminal;
a second terminal having a potential that is different from a potential of the first terminal;
a piezoelectric body portion; and
a plurality of interdigital transducer electrodes provided on or above the piezoelectric body portion and electrically connected to the first terminal and the second terminal; wherein
each of the plurality of interdigital transducer electrodes includes:
　a first busbar;
　a second busbar opposed to the first busbar in a first direction;
　a plurality of first electrode fingers connected to the first busbar and extending from the first busbar toward the second busbar in the first direction; and
　a plurality of second electrode fingers connected to the second busbar and extending from the second busbar toward the first busbar in the first direction;
the plurality of first electrode fingers and the plurality of second electrode fingers are spaced apart from each other in a second direction perpendicular or substantially perpendicular to the first direction;
at least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger;
each of the first busbar and the second busbar includes:
　an opening portion;
　an inner busbar portion located closer to the plurality of first electrode fingers and the plurality of second electrode fingers than the opening portion in the first direction;
　an outer busbar portion located across the opening portion from the inner busbar portion in the first direction; and
　a coupling portion coupling the inner busbar portion and the outer busbar portion in the first direction;
where, of the plurality of interdigital transducer electrodes, one of the two interdigital transducer electrodes adjacent to each other in the second direction is a first interdigital transducer electrode and another one of the two interdigital transducer electrodes is a second interdigital transducer electrode;
where, of a group of electrode fingers including the plurality of first electrode fingers and the plurality of second electrode fingers of the first interdigital transducer electrode, the electrode finger located at an end closer to the second interdigital transducer electrode in the second direction is a first end electrode finger of the first interdigital transducer electrode and the electrode finger located at an end away from the second interdigital transducer electrode is a second end electrode finger of the first interdigital transducer electrode, and, of a group of electrode fingers including the plurality of first electrode fingers and the plurality of second electrode fingers of the second interdigital transducer electrode, the electrode finger located at an end closer to the first interdigital transducer electrode in the second direction is a first end electrode finger of the second interdigital transducer electrode and the electrode finger located at an end away from the first interdigital transducer electrode is a second end electrode finger of the second interdigital transducer electrode;
the first end electrode finger of the first interdigital transducer electrode is connected to the first terminal;
the first end electrode finger of the second interdigital transducer electrode is connected to the second terminal; and
in each of the first interdigital transducer electrode and the second interdigital transducer electrode, the outer busbar portion electrically connected to one of the first terminal and the second terminal, different from the terminal to which the first end electrode finger is connected, is located on an inner side in the second direction relative to the inner busbar portion electrically connected to the one of the first terminal and the second terminal, different from the terminal to which the first end electrode finger is connected.

10. An acoustic wave device comprising:
a first terminal;
a second terminal having a potential that is different from a potential of the first terminal;
a piezoelectric body portion; and
a plurality of interdigital transducer electrodes provided on or above the piezoelectric body portion and electrically connected to the first terminal and the second terminal; wherein
each of the plurality of interdigital transducer electrodes includes:
　a first busbar;
　a second busbar opposed to the first busbar in a first direction;
　a plurality of first electrode fingers connected to the first busbar and extending from the first busbar toward the second busbar in the first direction; and a plurality of second electrode fingers connected to the second busbar and extending from the second busbar toward the first busbar in the first direction;

the plurality of first electrode fingers and the plurality of second electrode fingers are spaced apart from each other in a second direction perpendicular or substantially perpendicular to the first direction;

at least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger;

each of the first busbar and the second busbar includes:
an opening portion;
an inner busbar portion located closer to the plurality of first electrode fingers and the plurality of second electrode fingers than the opening portion in the first direction;
an outer busbar portion located across the opening portion from the inner busbar portion in the first direction; and
a coupling portion coupling the inner busbar portion and the outer busbar portion in the first direction;

in at least one interdigital transducer electrode of the plurality of interdigital transducer electrodes, where, of a group of electrode fingers including the plurality of first electrode fingers and the plurality of second electrode fingers, the electrode finger located at one end in the second direction is a first end electrode finger and the electrode finger located at another end is a second end electrode finger, the first end electrode finger is located closer to the interdigital transducer electrode adjacent to the at least one interdigital transducer electrode in the second direction; and in the at least one interdigital transducer electrode, the outer busbar portion of one of the first busbar and the second busbar, not connected to the first end electrode finger, is located on an inner side in the second direction relative to the inner busbar portion of one of the first busbar and the second busbar, not connected to the first end electrode finger, at least at a side closer to the adjacent interdigital transducer electrode.

* * * * *